United States Patent
Sato

(10) Patent No.: US 10,409,177 B2
(45) Date of Patent: Sep. 10, 2019

(54) LIQUID IMMERSION EXPOSURE APPARATUS

(71) Applicant: NIKON CORPORATION, Tokyo (JP)

(72) Inventor: Shinji Sato, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/935,661

(22) Filed: Mar. 26, 2018

(65) Prior Publication Data
US 2018/0217511 A1 Aug. 2, 2018

Related U.S. Application Data

(63) Continuation of application No. 15/394,373, filed on Dec. 29, 2016, now Pat. No. 9,927,724, which is a continuation of application No. 15/015,704, filed on Feb. 4, 2016, now Pat. No. 9,557,654, which is a continuation of application No. 13/800,448, filed on Mar. 13, 2013, now Pat. No. 9,268,231.

(60) Provisional application No. 61/622,182, filed on Apr. 10, 2012.

(51) Int. Cl.
G03F 7/20 (2006.01)
(52) U.S. Cl.
CPC ........ *G03F 7/70866* (2013.01); *G03F 7/2041* (2013.01); *G03F 7/70341* (2013.01)
(58) Field of Classification Search
CPC .......... G03F 7/70725; G03F 7/70341
USPC ..................... 355/30, 53
See application file for complete search history.

(56) References Cited

U.S. PATENT DOCUMENTS

| | | | |
|---|---|---|---|
| 6,208,407 B1 | 3/2001 | Loopstra |
| 6,262,796 B1 | 7/2001 | Loopstra et al. |
| 6,341,007 B1 | 1/2002 | Nishi et al. |
| 6,452,292 B1 | 9/2002 | Binnard |
| 6,611,316 B2 | 8/2003 | Sewell |
| 6,778,257 B2 | 8/2004 | Bleeker et al. |

(Continued)

FOREIGN PATENT DOCUMENTS

| | | |
|---|---|---|
| EP | 1 713 113 A1 | 10/2006 |
| EP | 2 523 210 A1 | 11/2012 |

(Continued)

OTHER PUBLICATIONS

Jan. 29, 2016 Corrected Notice of Allowability issued in U.S. Appl. No. 13/800,448.
Oct. 15, 2015 Notice of Allowance issued in U.S. Appl. No. 13/800,448.
Jun. 15, 2015 Notice of Allowance issued in U.S. Appl. No. 13/800,448.

(Continued)

*Primary Examiner* — Hung Nguyen
(74) *Attorney, Agent, or Firm* — Oliff PLC

(57) ABSTRACT

A liquid immersion exposure apparatus is disclosed. It includes a projection system having a final element and a liquid immersion member that in turn includes a first member, which surrounds the final element and has a liquid supply port and a liquid suction port, and a second member, which is movable with respect to the first member and has a lower part under which a portion of a liquid immersion space is formed. During exposure of a plurality of shot regions of a substrate, the immersion space covers a portion of a surface of the substrate, and the first shot region is exposed while moving the substrate in a first scanning direction. After the exposure of the first shot region, the second shot region is exposed while moving the substrate in a second scanning direction.

15 Claims, 24 Drawing Sheets

(56) References Cited

U.S. PATENT DOCUMENTS

| | | | |
|---|---|---|---|
| 6,897,963 B1 | 5/2005 | Taniguchi et al. | |
| 7,355,676 B2 * | 4/2008 | Sogard | G03F 7/70341 355/53 |
| 7,864,292 B2 | 1/2011 | Leenders et al. | |
| 8,004,651 B2 | 8/2011 | Nagasaka | |
| 8,068,209 B2 | 11/2011 | Poon et al. | |
| 8,134,685 B2 | 3/2012 | Nishii et al. | |
| 8,237,911 B2 | 8/2012 | Poon et al. | |
| 8,289,497 B2 | 10/2012 | Poon et al. | |
| 8,400,610 B2 | 3/2013 | Poon et al. | |
| 8,477,283 B2 | 7/2013 | Nishii | |
| 8,610,873 B2 | 12/2013 | Poon et al. | |
| 8,743,343 B2 | 6/2014 | Poon et al. | |
| 8,891,059 B2 | 11/2014 | Nagasaka | |
| 8,896,806 B2 | 11/2014 | Sato | |
| 8,934,080 B2 | 1/2015 | Poon et al. | |
| 9,013,675 B2 | 4/2015 | Nishii et al. | |
| 2007/0110213 A1 | 5/2007 | Leenders et al. | |
| 2007/0177125 A1 | 8/2007 | Shibazaki | |
| 2007/0288121 A1 | 12/2007 | Shibazaki | |
| 2008/0049209 A1 | 2/2008 | Nagasaka et al. | |
| 2013/0188159 A1 | 7/2013 | Shibazaki | |
| 2013/0265555 A1 | 10/2013 | Shibazaki | |
| 2014/0022522 A1 | 1/2014 | Sato | |
| 2014/0253886 A1 | 9/2014 | Sato | |
| 2014/0285781 A1 | 9/2014 | Sato | |
| 2014/0300875 A1 | 10/2014 | Sato et al. | |
| 2014/0307235 A1 | 10/2014 | Sato | |

FOREIGN PATENT DOCUMENTS

| | | | |
|---|---|---|---|
| JP | WO99/49504 | * | 9/1999 |
| JP | 2009-088037 A | | 4/2009 |
| JP | 2010-157726 A | | 7/2010 |
| WO | 01/35168 A1 | | 5/2001 |
| WO | 2004/019128 A2 | | 3/2004 |
| WO | 2011/083724 A1 | | 7/2011 |

OTHER PUBLICATIONS

Dec. 23, 2015 Chinese Office Action issued in Chinese Application No. 201380029828.3.
Jan. 29, 2015 Office Action issued in U.S. Appl. No. 13/800,448.
Jul. 31, 2013 International Search Report issued in International Application No. PCT/JP2013/059432.
Jul. 31, 2013 Written Opinion issued in International Application No. PCT/JP2013/059432.
Oct. 4, 2016 Office Action issued in Japanese Application No. 2014-550223.
Oct. 18, 2016 Office Action issued in Chinese Application No. 201380029828.3.
Sep. 16, 2016 Notice of Allowance issued in U.S. Appl. No. 15/015,704.
Jan. 12, 2017 Office Action issued in Taiwanese Patent Application No. 102109844.
Jun. 28, 2017 Office Action issued in Chinese Patent Application No. 201380029828.3.
Nov. 14, 2016 Corrected Notice of Allowability issued in U.S. Appl. No. 15/015,704.
Nov. 25, 2016 Corrected Notice of Allowability issued in U.S. Appl. No. 15/015,704.
Nov. 28, 2017 Notice of Allowance issued in U.S. Appl. No. 15/394,373.
Aug. 4, 2017 Corrected Notice of Allowability issued in U.S. Appl. No. 15/394,373.
Jun. 28, 2017 Notice of Allowance issued in U.S. Appl. No. 15/394,373.
May 17, 2017 Office Action issued in U.S. Appl. No. 15/394,373.
Sep. 26, 2018 Office Action issued in European Patent Application No. 13718236.6.
Oct. 12, 2018 Office Action issued in Taiwanese Application No. 106123571.
Apr. 2, 2019 Office Action issued in Japanese Patent Application No. 2018-109154.
Apr. 12, 2019 Office Action issued in European Patent Application No. 13 718 236.6.

* cited by examiner

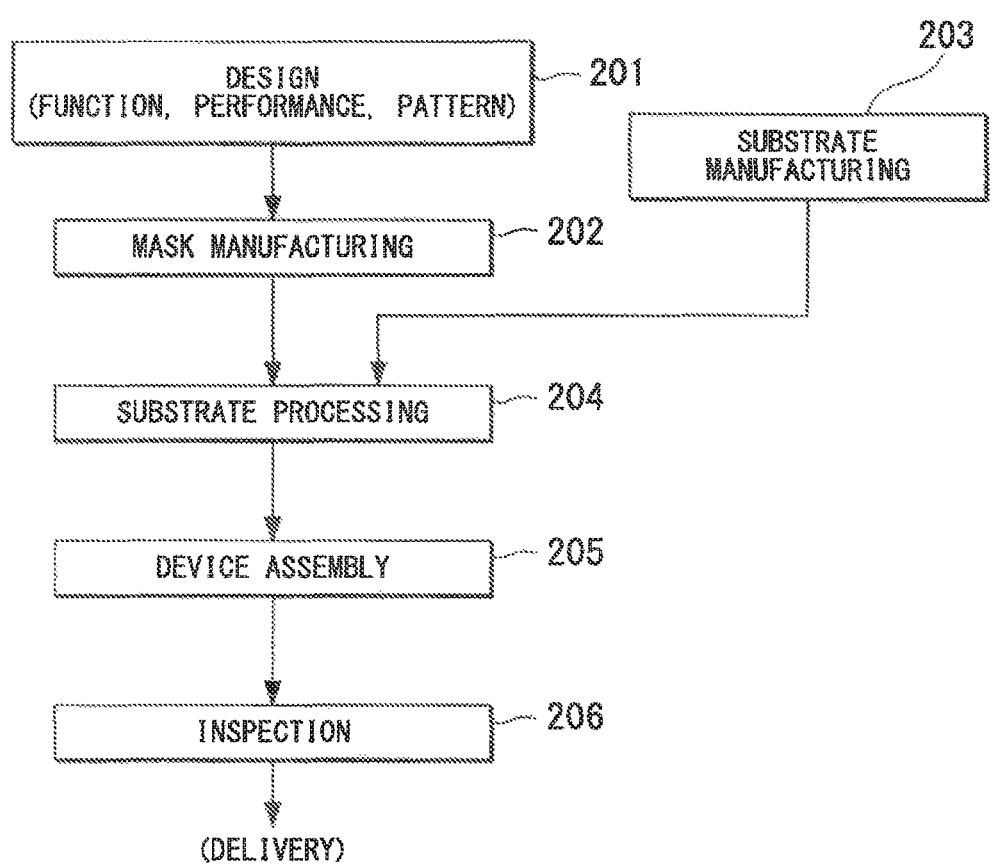

LIQUID IMMERSION EXPOSURE APPARATUS

CROSS-REFERENCE TO RELATED APPLICATION

This application is a continuation application of U.S. application Ser. No. 15/394,373, filed Dec. 29, 2016, and issued on Mar. 27, 2018 as U.S. Pat. No. 9,927,724, which is a continuation application of U.S. application Ser. No. 15/015,704, filed Feb. 4, 2016, and issued on Jan. 31, 2017 as U.S. Pat. No. 9,557,654, which claims priority to and the benefit of U.S. application Ser. No. 13/800,448, filed Mar. 13, 2013, and issued on Feb. 23, 2016 as U.S. Pat. No. 9,268,231, which claims priority to and the benefit of U.S. provisional application No. 61/622,182, filed Apr. 10, 2012. The contents of each of these applications are incorporated herein by reference.

BACKGROUND

Field of the Invention

The present invention relates to a liquid immersion member, an exposure apparatus, an exposing method, a method for manufacturing a device, a program, and a recording medium.

Description of Related Art

For example, in an exposure apparatus which is used in a photolithography process, as disclosed in U.S. Pat. No. 7,864,292, a liquid immersion exposure apparatus for exposing a substrate by exposure light via a liquid is known.

SUMMARY

In a liquid immersion exposure apparatus, for example, if liquid flows out from a predetermined space or remains on an object such as a substrate, exposure failure may occur. As a result, a defective device may result.

An object of the aspect of the present invention is to provide a liquid immersion member, an exposure apparatus, and an exposing method capable of suppressing the occurrence of exposure failure. Moreover, another object of the aspect of the present invention is to provide a method for manufacturing a device, a program, and a recording medium capable of suppressing the occurrence of a defective device.

According to a first aspect of the present invention, a liquid immersion member is provided that forms a liquid immersion space on an object which is movable below an optical member so that an optical path of exposure light emitted from an emitting surface of the optical member is filled with liquid, the liquid immersion member including: a first member that is disposed at at least a portion of a surrounding of the optical member, and that comprises a first lower surface and a first recovery part which is disposed at outside of the first lower surface with respect to the optical path; and a second member that is disposed at at least a portion of a surrounding of the optical path below the first member, that comprises a second upper surface which faces the first lower surface via a gap and a second lower surface to which the object is able to face, and that is movable with respect to the first member, wherein the object is able to face at least a portion of the first recovery part, and at least a portion of the liquid from at least one of a first space, to which the second upper surface faces, and a second space, to which the second lower surface faces, is able to be recovered from the first recovery part.

According to a second aspect of the present invention, a liquid immersion member is provided that forms a liquid immersion space on an object which is movable below an optical member so that an optical path of exposure light emitted from an emitting surface of the optical member is filled with liquid, the liquid immersion member including: a first member that is disposed at at least a portion of a surrounding of the optical member and that comprises a first tower surface; a second member that is disposed at at least a portion of a surrounding of the optical path below the first member, that comprises a second lower surface to which the object is able to face, and that is movable with respect to the first member; and a recovery part that is disposed at outside of the first lower surface with respect to the optical path, wherein liquid recovery from a space between the first member and the second member is performed by the recovery part.

According to a third aspect of the present invention, a liquid immersion member is provided that forms a liquid immersion space on an object which is movable below an optical member so that an optical path of exposure light emitted from an emitting surface of the optical member is filled with liquid, the liquid immersion member including: a first member that is disposed at at least a portion of a surrounding of the optical member and that comprises a first lower surface; a second member that is disposed at at least a portion of a surrounding of the optical path below the first member, that comprises a second lower surface to which the object is able to face, and that is movable with respect to the first member; and a recovery part in that at least a portion thereof recovers a liquid from a space between the second member and the object at an outside of the second lower surface with respect to the optical path.

According to a fourth aspect of the present invention, a liquid immersion member is provided that forms a liquid immersion space on an object which is movable below an optical member so that an optical path of exposure light emitted from an emitting surface of the optical member is filled with liquid, the liquid immersion member including: a first member that is disposed at at least a portion of a surrounding of the optical member and that comprises a first lower surface; a second member, that is disposed at at least a portion of a surrounding of the optical path below the first member, that comprises a second upper surface which is able to face the first lower surface and a second lower surface to which the object is able to face, and that is movable with respect to the first member; a supply part that is disposed above of the second upper surface and that is able to supply the liquid; and a recovery part that is disposed above of the second upper surface and that is able to recover the liquid, wherein at least a portion of the liquid from the supply part is supplied to a space between the first lower surface and the second upper surface, and at least a portion of a liquid of the space between the first lower surface and the second upper surface is recovered from the recovery part.

According to a fifth aspect of the present invention, an exposure apparatus is provided which exposes a substrate by exposure light via a liquid, including: the liquid immersion member according to any one of the first aspect to fourth aspect.

According to a sixth aspect of the present invention, an exposure apparatus is provided that exposes a substrate by exposure light via a liquid, the exposure apparatus comprising: a liquid immersion member that forms a liquid immersion space on an object which is movable below an optical member so that an optical path of exposure light emitted from an emitting surface of the optical member is filled with liquid, wherein the liquid immersion member comprises: a first member that is disposed at at least a portion of a surrounding of the optical member, and that comprises a first lower surface and a first recovery part which is disposed at outside of the first lower surface with respect to the optical path; and a second member that is disposed at at least a portion of a surrounding of the optical path below the first member, and that comprises a second upper surface which faces the first lower surface via a gap, a second lower surface to which the object is able to face, and a second recovery part which is disposed at the second lower surface and is able to recover the liquid, wherein the object is able to face at least a portion of the first recovery part, and at least a portion of the liquid from at least one of a first space, which the second upper surface faces, and a second space, which the second lower surface faces, is recovered from the first recovery part.

According to a seventh aspect of the present invention, an exposure apparatus is provided that exposes a substrate by exposure light via a liquid, the exposure apparatus comprising: a liquid immersion member that forms a liquid immersion space on an object which is movable below an optical member so that an optical path of exposure light emitted from an emitting surface of the optical member is filled with liquid, wherein the liquid immersion member comprises: a first member that is disposed at at least a portion of a surrounding of the optical member, and comprises a first lower surface and a first recovery part disposed at outside of the first lower surface with respect to the optical path; and a second member that is disposed at at least a portion of a surrounding of the optical path below the first member, and that comprises a second upper surface which faces the first lower surface via a gap and a second lower surface to which the object is able to face, wherein the substrate is able to face at least a portion of the first recovery part, at least a portion of the liquid from at least one of a first space, which the second upper surface faces, and a second space, which the second lower surface faces, is recovered from the first recovery part, the substrate moves a second pathway after the substrate moved a first pathway in a plane substantially perpendicular to an optical axis of the optical member in a state where the liquid immersion space is formed, a movement of the substrate in the first pathway comprises a movement in a first direction parallel to a first axis, a movement of the substrate in the second pathway comprises a movement in a second direction parallel to a second axis perpendicular to the first axis, the second member is able to be divided into a first portion, and a second portion adjacent to the first portion with respect to a direction parallel to the second axis, the first portion and the second portion are disposed so as to be away from each other during at least a part of a period in which the substrate moves the first pathway in a state where the liquid immersion space is formed, and the first portion and the second portion approach or contact each other during at least a part of a period in which the substrate moves the second pathway.

According to an eighth aspect of the present invention, a method for manufacturing a device is provided, including the steps of: exposing a substrate using the exposure apparatus according to any one of the fifth aspect to seventh aspect; and developing the exposed substrate.

According to a ninth aspect of the present invention, a method for exposing a substrate by exposure light via a liquid is provided, including the steps of: forming a liquid immersion space so that an optical path of the exposure light emitted from an emitting surface of an optical member is filled with liquid; exposing the substrate by the exposure light emitted from the emitting surface via the liquid of the liquid immersion space; moving a second member that is disposed at at least a portion of a surrounding of the optical path below a first member and comprises a second upper surface, which faces a first lower surface via a gap, and a second lower surface, which the object is able to face, with respect to the first member that is disposed at at least a portion of a surrounding of the optical member and that comprises the first lower surface and a first recovery part disposed at outside of the first lower surface with respect to the optical path; and recovering at least a portion of the liquid of at least one of a first space, which the second upper surface faces, and a second space, which the second lower surface faces, from the first recovery part.

According to a tenth aspect of the present invention, a method for manufacturing a device is provided, including the steps of: exposing a substrate using the exposing method according to the ninth aspect, and developing the exposed substrate.

According to an eleventh aspect of the present invention, a program that causes a computer to executes a control of an exposure apparatus exposing a substrate by exposure light via a liquid, wherein the program performs: forming a liquid immersion space so that an optical path of the exposure light emitted from an emitting surface of an optical member is filled with liquid; exposing the substrate by the exposure light emitted from the emitting surface via the liquid of the liquid immersion space; moving a second member that is disposed at at least a portion of a surrounding of the optical path below a first member and comprises a second upper surface which faces a first lower surface via a gap and a second lower surface which the object is able to face, with respect to the first member that is disposed at at least a portion of a surrounding of the optical member and that comprises the first lower surface and a first recovery part disposed at outside: of the first lower surface with respect to the optical path; and recovering at least a portion of the liquid of at least one of a first space, which the second upper surface faces, and a second space, which the second lower surface faces, from the first recovery part.

According to a twelfth aspect of the present invention, a computer-readable recording medium is provided which records the program according to the eleventh aspect.

According to the aspects of the present invention, the occurrence of exposure failure can be suppressed. In addition, according to the aspects of the present invention, the occurrence of a defective device can be suppressed.

BRIEF DESCRIPTION OF THE DRAWINGS

FIG. 25 is a flowchart for explaining an example of a method for manufacturing a device.

DESCRIPTION OF EMBODIMENTS

Hereinafter, embodiments of the present invention will be described referring to drawings. However, the present invention is not limited thereto. In the description below, an XYZ rectangular coordinate system is set, and a positional relationship of each portion will be described referring to the XYZ rectangular coordinate system. A predetermined direction in a horizontal surface is set to an X axis direction, a direction perpendicular to the X axis direction in the horizontal surface is set to a Y axis direction, and a direction (that is, a vertical direction) perpendicular to each of the X axis direction and the Y axis direction is set to a Z axis direction. Moreover, the rotation (inclination) directions around the X axis, the Y axis, and the Z axis are set to θX direction, θY direction, and θZ direction.

First Embodiment

Figure 1:
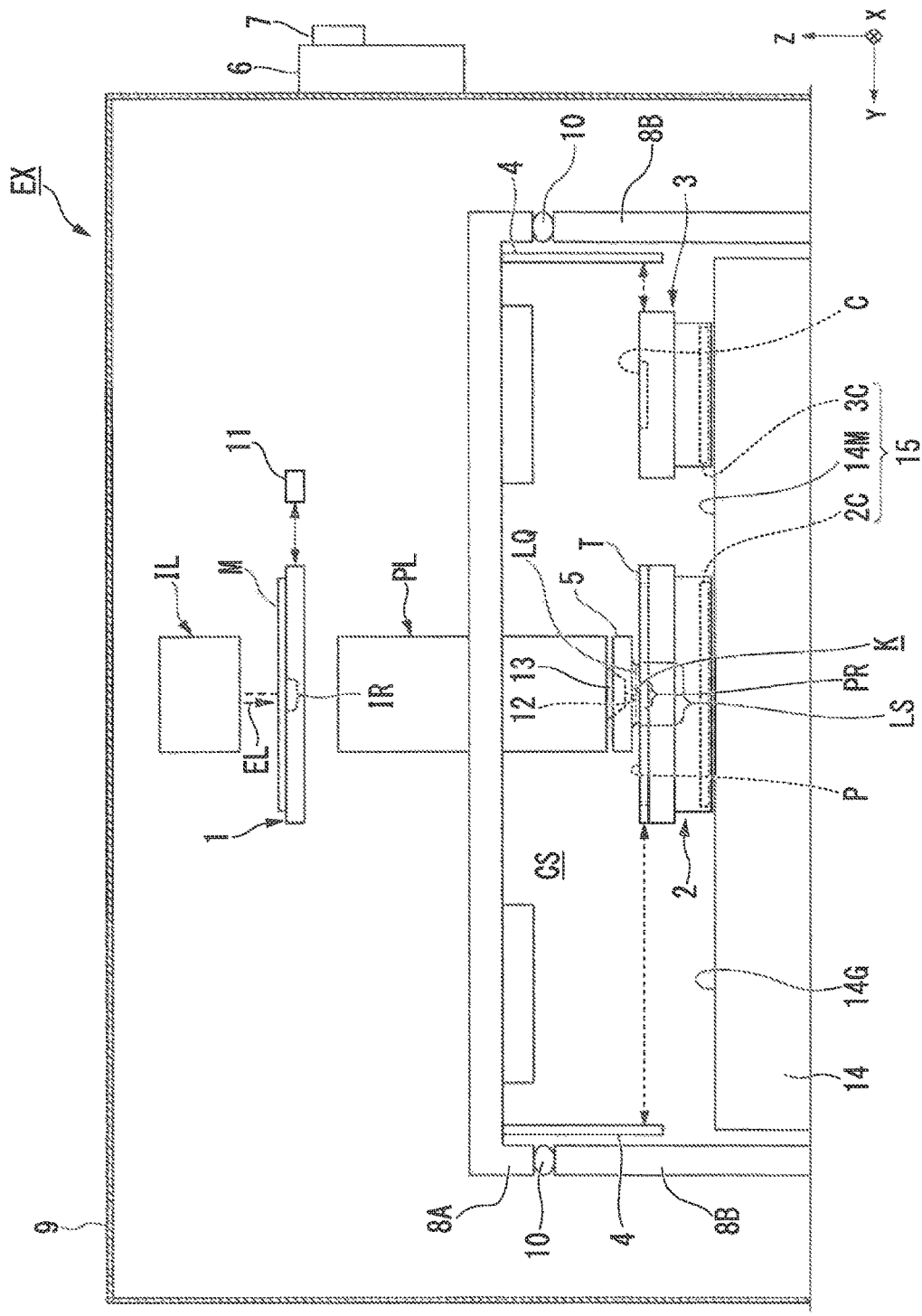
FIG. 1 is a view showing an example of an exposure apparatus according to a first embodiment.

A first embodiment will be described. FIG. 1 is a schematic configuration view showing an example of an exposure apparatus EX according to a first embodiment. The exposure apparatus EX of the present embodiment is a liquid immersion exposure apparatus which exposes a substrate P via a liquid LQ using exposure light EL. In the present embodiment, a liquid immersion space LS is formed so that an optical path K of the exposure light EL which is radiated to the substrate P is filled with the liquid LQ. The liquid immersion space LS means a portion (space or region) which is filled with the liquid. The substrate P is exposed by the exposure light EL via the liquid LQ of the liquid immersion space LS. In the present embodiment, water (pure water) is used for the liquid LQ.

Furthermore, for example, the exposure apparatus EX of the present embodiment is an exposure apparatus which includes a substrate stage and a measurement stage as disclosed in, for example, U.S. Pat. No. 6,897,963, European Patent Application, Publication No. 1713113, and the like.

In FIG. 1, the exposure apparatus EX includes: a mask stage 1 which is movable while holding a mask M; a substrate stage 2 which is movable while holding a substrate P; a measurement stage 3 which does not hold the substrate P, and which is movable while mounting a measurement member (measurement instrument) C which measures the exposure light EL is mounted; a measurement system 4 which measures positions of the substrate stage 2 and the measurement stage 3; an illumination system IL which illuminates the mask M with the exposure light EL; a projection optical system PL which projects an image of a pattern of the mask M which is illuminated with the exposure light EL to the substrate P; a liquid immersion member 5 which forms the liquid immersion space LS; a controller 6 which controls an operation of the entire exposure apparatus EX; and a storage part 7 which is connected to the controller 6 and stores various information with respect to the exposure.

Furthermore, the exposure apparatus EX includes a reference frame 8A which supports a projection optical system PL and various measurement systems including the measurement system 4, an apparatus frame 8B which supports the reference frame 8A, and a vibration isolator 10 which is disposed between the reference frame 8A and the apparatus frame 8B, and suppresses transmission of vibration from the apparatus frame 8B to the reference frame 8A. The vibration isolator 10 includes a spring apparatus or the like. In the present embodiment, the vibration isolator 10 includes a gas spring (for example, air mount). Moreover, a detection system which detects an alignment mark of the substrate P or a detection system which detects the surface of the object such as the substrate P may be supported by the reference frame 8A.

Furthermore, the exposure apparatus EX includes a chamber apparatus 9 which adjusts an environment (at least one of temperature, humidity, pressure, and a degree of cleanness) of a space CS to which the exposure light EL advances. At least the projection optical system PL, the liquid immersion member 5, the substrate stage 2, and the measurement stage 3 are disposed in the space CS. In the present embodiment, at least a portion of the mask stage 1 and the illumination system IL is also disposed in the space CS.

The mask M includes a reticle on which a device pattern projected to the substrate P is formed. The mask M includes a transmission type mask which includes a transparent plate, for example, a glass plate and the like, and a transmission type mask which includes a pattern formed on the transparent plate using a light-shielding material such as chromium. Moreover, a reflection type mask may be used for the mask M.

The substrate P is a substrate for manufacturing a device. For example, the substrate P includes a base material such as a semiconductor wafer and a photosensitive film which is formed on the base material. The photosensitive film is a film of a photosensitive material (photoresist). Furthermore, the substrate P may include another film in addition to the photosensitive film. For example, the substrate P may include an antireflection film and a protective film (top coat film) which protects the photosensitive film.

The illumination system IL radiates the exposure light EL to a predetermined illumination region IR. The illumination region IR includes positions which can be irradiated with the exposure light EL emitted from the illumination system IL. The illumination system IL illuminates at least a portion of the mask M disposed in the illumination region IR by the exposure light EL having a uniform illumination distribution. For example, as for the exposure light EL which is emitted from the illumination system IL, far-ultraviolet light (DUV light) such as a bright line (g-line, h-line, i-line) emitted from a mercury lamp and KrF excimer laser light (248 nm in wavelength), ArF excimer laser light (193 nm in wavelength), vacuum-ultraviolet light (VUV light) such as $F_2$ laser light (157 nm in wavelength), and the like are used. In the present embodiment, as for the exposure light EL, ArF excimer laser light, which is ultraviolet light (vacuum-ultraviolet light), is used.

The mask stage 1 is movable in a state where it holds the mask M. For example, the mask stage 1 is moved by an operation of a driving system 11 which includes a planar motor as disclosed in U.S. Pat. No. 6,452,292. In the present embodiment, the mask stage 1 is able to move in six directions of the X axis, the Y axis, the Z axis, the θX, the θY, and the θZ directions by the operation of the driving system 11. Moreover, the driving system 11 may not include a planar motor. For example, the driving system 11 may include a linear motor.

The projection optical system PL radiates the exposure light EL to a predetermined projection region PR. The projection region PR includes positions which can be irradiated with the exposure light EL emitted from the projection optical system EL. The projection optical system PL projects the image of the pattern of the mask M on at least a portion of the substrate P disposed in the projection region PR by a predetermined projection magnification. For example, the projection optical system PL of the present embodiment may be a reduction system. In which the projection magnification is ¼, ⅕, ⅛, or the like. Furthermore, the projection optical system PL may be any of an equal magnification system and an enlargement system. In the present embodiment, the optical axis of the projection optical system PL is parallel to the Z axis. Furthermore, the projection optical system PL may be any of a refraction system which does not include a reflective optical element, a reflection system which does not include a refractive optical element, or a reflective refraction system which includes the reflective optical element and the refractive optical element. Moreover, the projection optical system PL may form any of an inverted image and an erected image.

The projection optical system PL includes a terminal optical element 13 which includes an emitting surface 12 to which the exposure light EL is emitted. The emitting surface 12 emits the exposure light EL toward the image surface of the projection optical system PL. The terminal optical element 13 is an optical element nearest to the image surface of the projection optical system PL among the plurality of optical elements of the projection optical system PL. The projection region PR includes positions which can be irradiated with the exposure light EL emitted from the emitting surface 12. In the present embodiment, the emitting surface 12 faces the –Z axis direction and is parallel to the XY plane. Furthermore, the emitting surface 12 facing the –Z axis direction may be a convex surface or a concave surface. Moreover, the emitting surface 12 may be inclined with respect to the XY plane and may include a curved surface. In the present embodiment, the optical axis of the terminal optical element 13 is parallel to the Z axis. In the present embodiment, the exposure light EL which is emitted from the emitting surface 12 is parallel to the –Z axis direction.

The substrate stage 2 is able to move in the XY plane, which includes positions (projection region PR) which can be irradiated with the exposure light EL from the emitting surface 12, in a state where the substrate stage holds the substrate P. The measurement stage 3 is able to move in the XY plane, which includes positions (projection region PR) which can be irradiated with the exposure light EL from the emitting surface 12, in a state where a measurement member (measuring instrument) C is mounted on the measurement stage. Each of the substrate stage 2 and the measurement stage 3 is able to move on a guide surface 14G of a base member 14. In the present embodiment, the guide surface 14G and the XY plane are substantially parallel to each other.

In the present embodiment, the substrate stage 2 includes a first holding portion which releasably holds the substrate P and a second holding portion which is disposed at a surrounding of the first holding portion and releasably holds a cover member T as disclosed in, for example, U.S. Patent Application, Publication No. 2007/0177125, U.S. Patent Application, Publication No. 2008/0049209, and the like. The first holding portion holds the substrate P so that the surface (upper surface) of the substrate P and the XY plane are substantially parallel to each other. In the present embodiment, the upper surface of the substrate P held by the first holding portion and the upper surface of the cover member T held by the second holding portion are disposed at the substantially same plane. Moreover, the upper surface of the substrate P held by the first holding portion and the upper surface of the cover member T held by the second holding portion may be not disposed at the same plane. Furthermore, the upper surface of the cover member T may be inclined with respect to the upper surface of the substrate P, and the upper surface of the cover member T may include a curved surface.

The substrate stage 2 and the measurement stage 3 are moved by an operation of a driving system 15 which includes a planar motor as disclosed in, for example, U.S. Pat. No. 6,452,292. The driving system 15 includes a mover 2C which is disposed at the substrate stage 2, a mover 3C which is disposed at the measurement stage 3, and a stator 14M which is disposed at the base member 14. Each of the substrate stage 2 and the measurement stage 3 is able to move on a guide surface 14G in six directions of the X axis, the Y axis, the Z axis, the θX, the θY, and the θZ axis directions by the operation of the driving system 15. Moreover, the driving system 15 may not include a planar motor. For example, the driving system 15 may include a linear motor.

The measurement system 4 includes an interferometer system. The interferometer system includes a part which radiates measurement light to a measurement mirror of the substrate stage 2 and a measurement mirror of the measurement stage 3 and measures the positions of the substrate stage 2 and the measurement stage 3. Moreover, for example, the measurement system may include an encoder system disclosed in U.S. Patent Application, Publication No. 2007/0288121. Furthermore, the measurement system 4 may include only one of the interferometer system and the encoder system.

When exposure processing of the substrate P is performed, or when predetermined measurement processing is performed, the controller 6 performs a position control of the substrate stage 2 (substrate P) and the measurement stage 3 (measurement member C) based on the measurement results of the measurement system 4.

Figure 2:
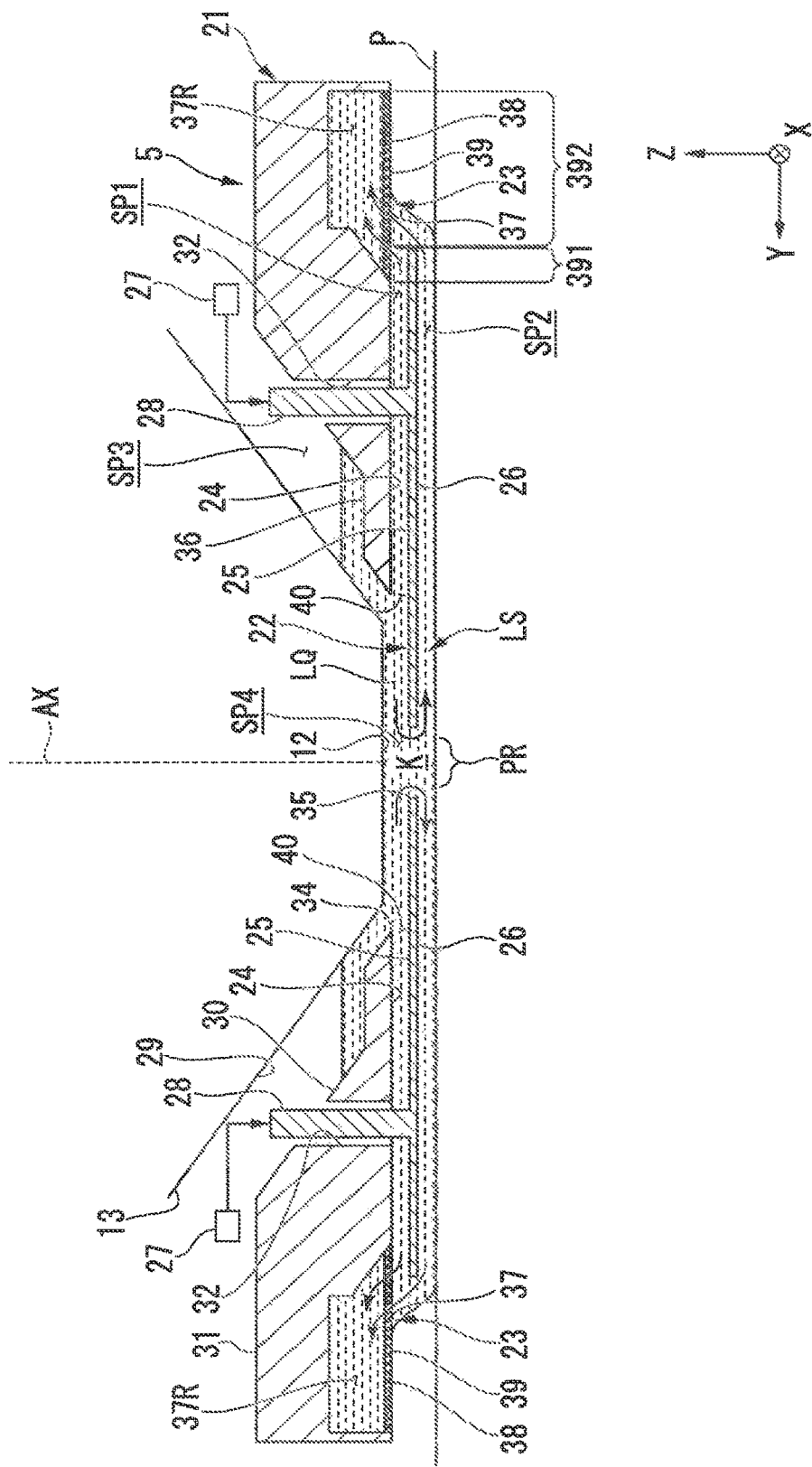
FIG. 2 is a side cross-sectional view showing an example of a liquid immersion member according to the first embodiment.
Figure 3:
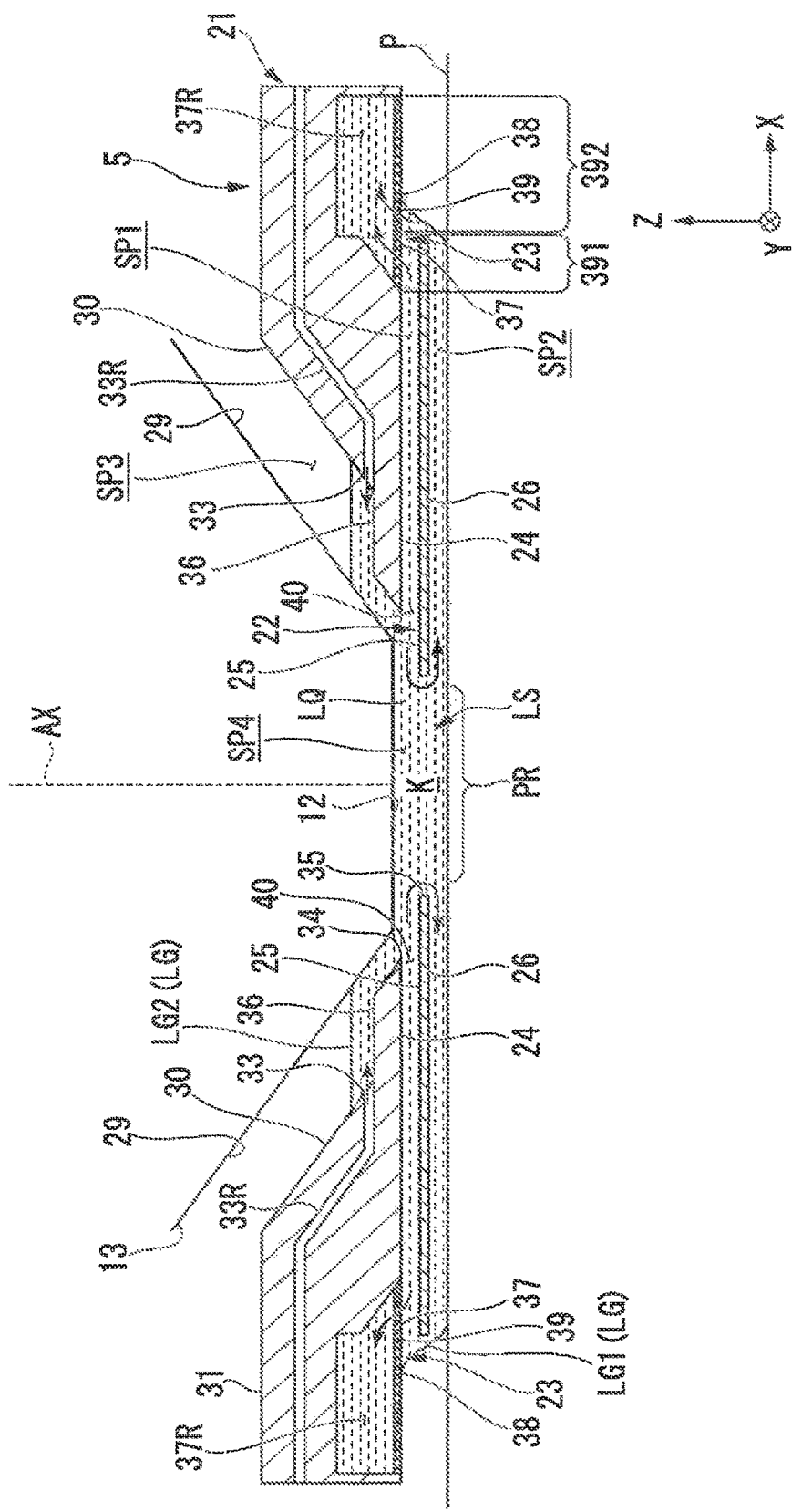
FIG. 3 is a side cross-sectional view showing an example of the liquid immersion member according to the first embodiment.
Figure 4:
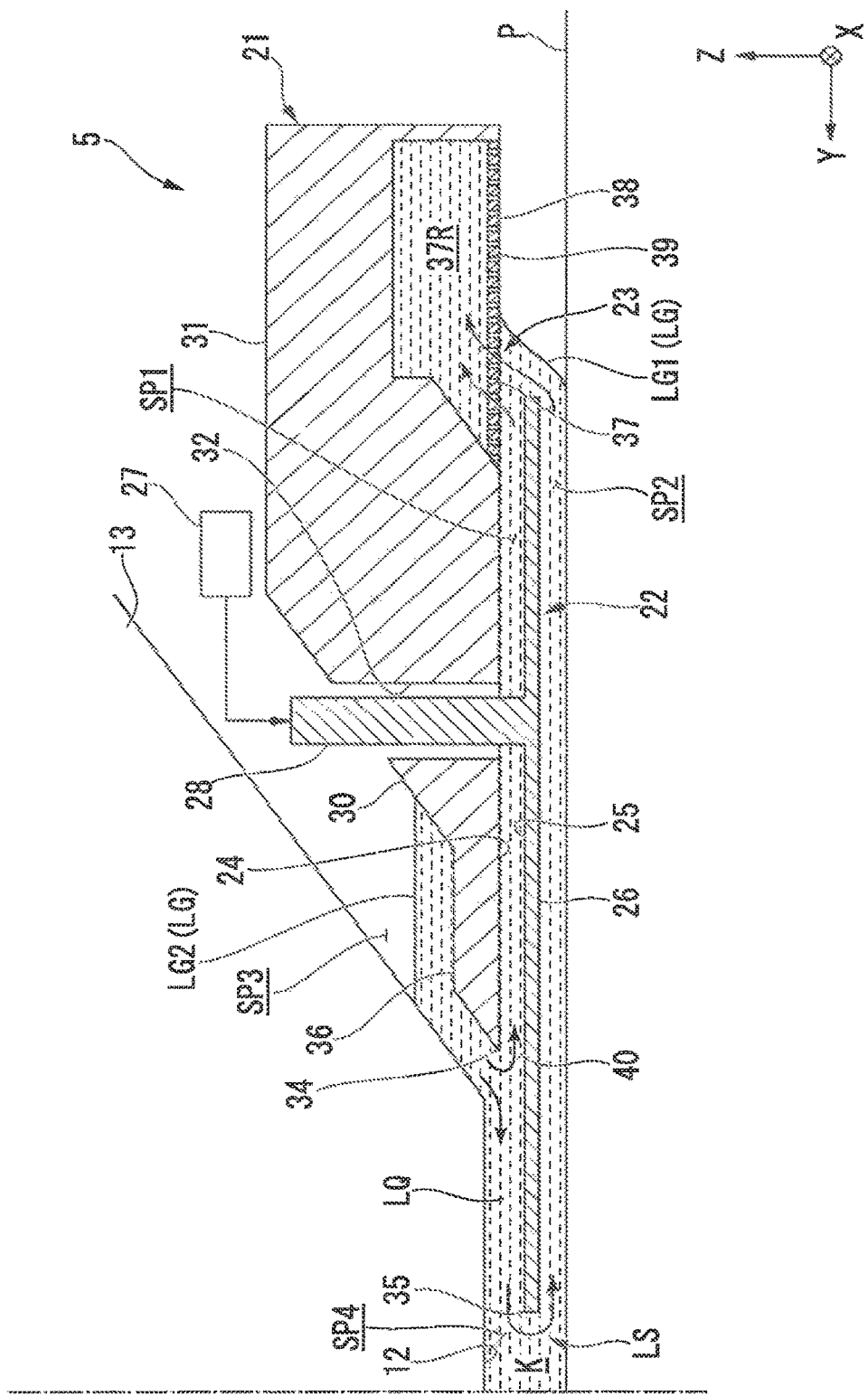
FIG. 4 is a side cross-sectional view showing an example of the liquid immersion member according to the first embodiment.
Figure 5:
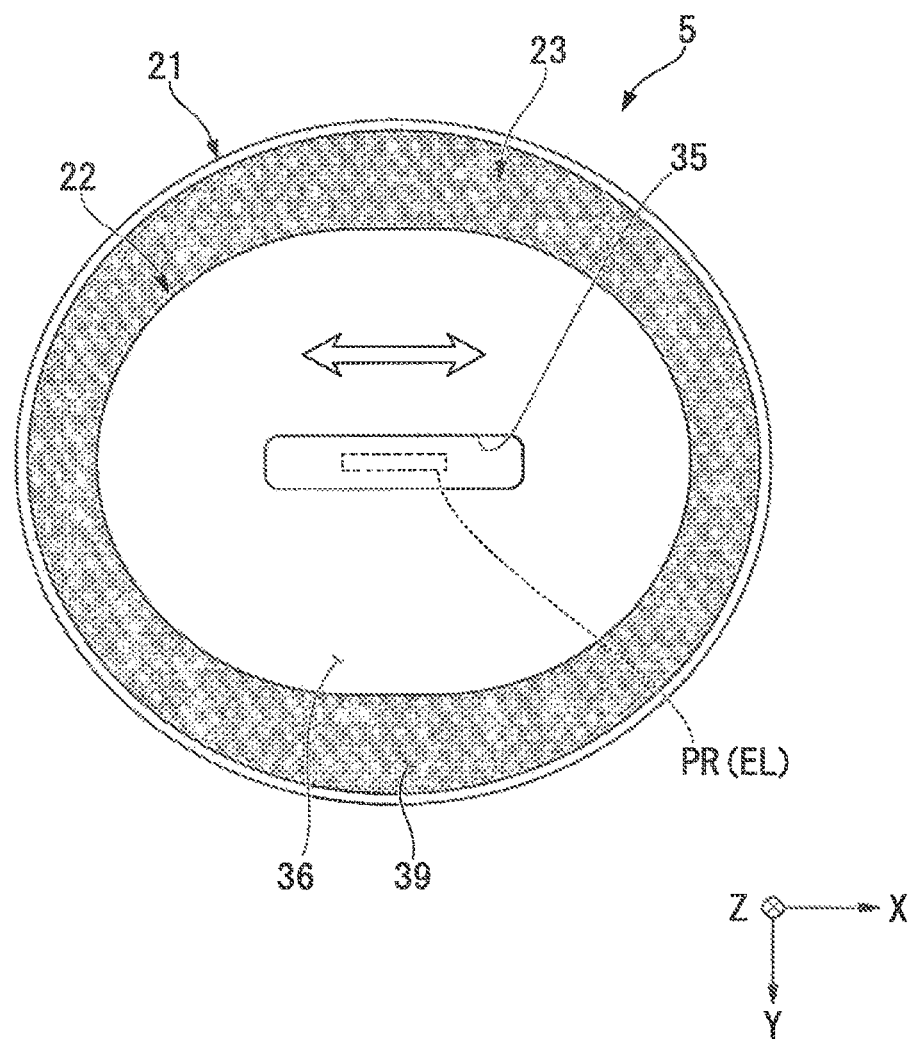
FIG. 5 is a view when the liquid immersion member according to the first embodiment is viewed from below.
Figure 6:
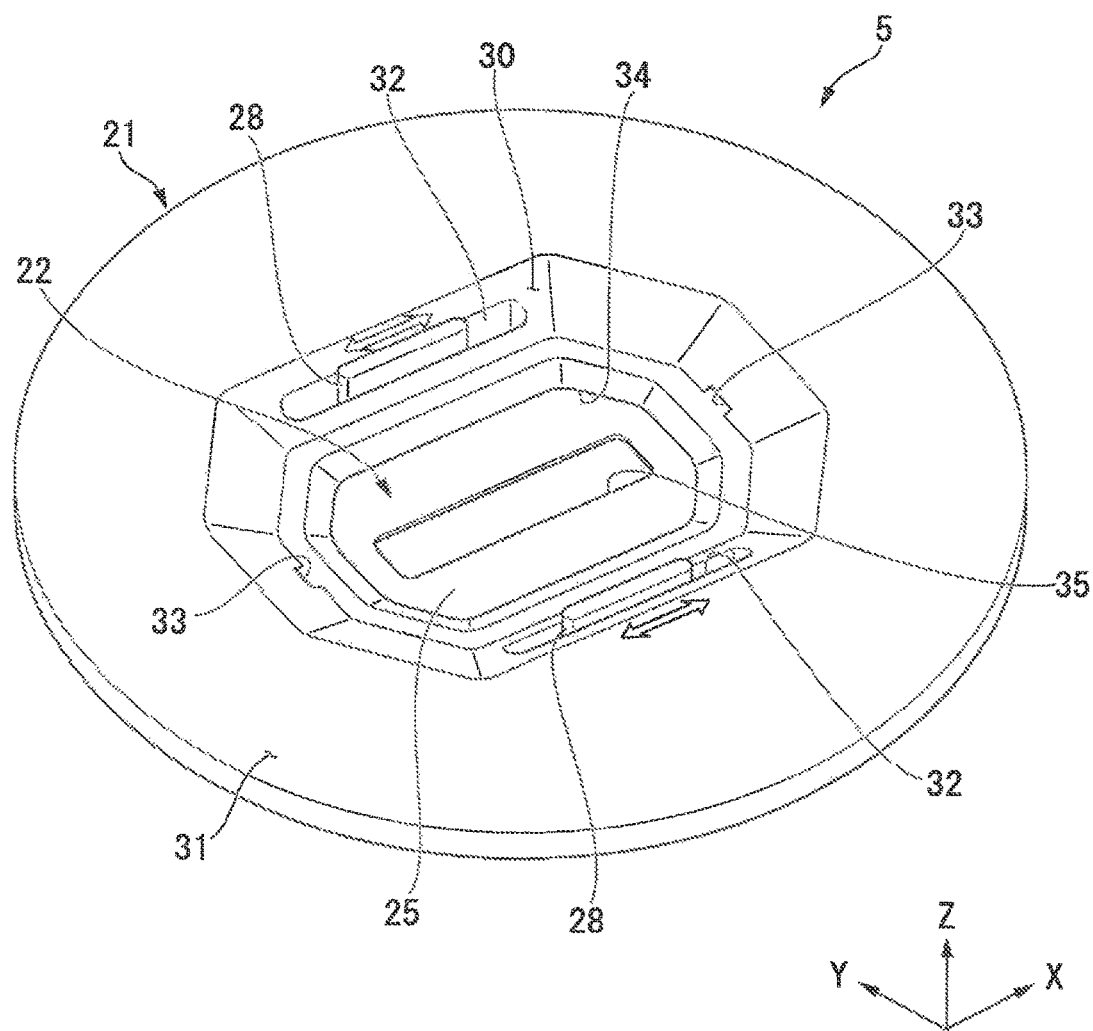
FIG. 6 is a perspective view showing an example of the liquid immersion member according to the first embodiment.

Next, the liquid immersion member 5 according to the present embodiment will be described. FIG. 2 is a cross-sectional view parallel to the YZ plane of the liquid immersion member 5. FIG. 3 is a cross-sectional view parallel to the XZ plane of the liquid immersion member 5, FIG. 4 is a view in which a portion of FIG. 2 is enlarged. FIG. 5 is a view when the immersion member 5 is viewed from below (−Z axis side). FIG. 6 is a perspective view of the liquid immersion member 5.

The liquid immersion member 5 forms a liquid immersion space LS so that an optical path K of the exposure light EL emitted from the emitting surface 12 of the terminal optical element 13 is filled with the liquid LQ. The liquid immersion space LS also includes at least a portion of the space between an object, which is movable in the XY plane including the position facing the emitting surface 12, and the liquid immersion member 5.

The object, which is able to move in the XY plane including the position facing the emitting surface 12, includes an object which is able to face the emitting surface 12, and includes an object which can be disposed in the projection region PR. The object includes an object which is able to move under the terminal optical element 13. In the present embodiment, the object includes at least one of at least a portion of the substrate stage 2 (for example, the cover member T of the substrate stage 2), the substrate P which is held by the substrate stage 2 (first holding portion), and the measurement stage 3. In the exposure of the substrate P, the liquid immersion space LS is formed so that the optical path K of the exposure light EL radiated to the substrate P is filled with the liquid LQ. When the exposure light EL is radiated to the substrate P, the liquid immersion space LS is formed so that only a portion of the surface region of the substrate P which includes the projection region PR is covered by the liquid LQ.

In the descriptions below, the object facing the emitting surface 12 is the substrate P. Moreover, as described above, the object which is able to face the emitting surface 12 may be at least one of the substrate stage 2 and the measurement stage 3, and may be an object different from the substrate P, the substrate stage 2, and the measurement stage 3. Moreover, the liquid immersion space LS may be formed so as to be positioned over the cover member T and the substrate P of the substrate stage 2, and the liquid immersion space LS may be formed so as to be positioned over the substrate stage 2 and the measurement stage 3.

In the present embodiment, the liquid immersion member 5 includes a first member 21, which at least a portion thereof is disposed at a surrounding of the terminal optical element 13 (optical path of the exposure light), a second member 22, which at least a portion thereof is disposed at a surrounding of the optical path K below the first member 21 and which is able to move with respect to the first member 21, and a recovery part 23 which recovers the liquid LQ. Furthermore, the liquid LQ may be recovered from the recovery part 23 along with gas, and the liquid LQ may be recovered from the recovery part 23 while the recovery of the gas is suppressed.

In the present embodiment, the optical path of the exposure light EL includes the optical path of the exposure light EL in the terminal optical element 13 (optical path of the exposure light which proceeds through the terminal optical element 13). Moreover, the optical path of the exposure light EL includes the optical path K of the exposure light EL which is emitted from the emitting surface 12. In the present embodiment, the first member 21 is disposed at at least a portion of a surrounding of the terminal optical element 13 (the optical path of the exposure light EL in the terminal optical element 13). Moreover, the first member 21 is may not be disposed at a surrounding of the terminal optical element 13 and may be disposed at at least a portion of a surrounding of the optical path K of the exposure light EL which is emitted from the emitting surface 12. The first member 21 may be disposed at at least a portion of a surrounding of the terminal optical element 13 and at least a portion of a surrounding of the optical path K of the exposure light EL which is emitted from the emitting surface 12.

In the present embodiment, the first member 21 is supported by the apparatus frame 8B via a support member (not shown). In addition, the first member 21 may be supported by the reference frame member 8A via the support member (not shown).

The first member 21 is disposed at a position further away from the substrate P (object) than the second member 22. At least a portion of the second member 22 is disposed between the first member 21 and the substrate P (object).

In the present embodiment, the first member 21 is disposed at a surrounding of the terminal optical element 13. The first member 21 is an annular member. The first member 21 is disposed so as not to contact the terminal optical element 13. A gap is formed between the first member 21 and the terminal optical element 13. In the present embodiment, the first member 21 does not face the emitting surface 12. In addition, a portion of the first member 21 may face the emitting surface 12. That is, a portion of the first member 21 may be disposed between the emitting surface 12 and the upper surface of the substrate P (object). In addition, the first member 21 may not be annular. For example, the first member 21 may be disposed at a portion of a surrounding of the terminal optical element 13 (optical path K). For example, a plurality of first members 21 may be disposed at a surrounding of the terminal optical element 13 (optical path K).

In the present embodiment, the second member 22 is disposed at a surrounding of the optical path K. The second member 22 is an annular member.

The first member 21 includes a lower surface 24 which is toward the −Z axis direction. The second member 22 includes an upper surface 25 which is toward the +Z axis direction and a lower surface 26 which is toward the −Z axis direction. The substrate P (object) is able to face the lower surface 26. The upper surface 25 faces the lower surface 24 via the gap. Moreover, in the present embodiment, the upper surface 25 faces the emitting surface 12 via the gap. Furthermore, it is not necessary for the upper surface 25 to face the emitting surface 12.

In the present embodiment, the lower surface 24 of the first member 21 does not recover the liquid LQ. The lower surface 24 is a non-recovery part and is not able to recover the liquid LQ. The lower surface 24 of the first member 21 is able to hold the liquid LQ between the lower surface and the second member 22. Moreover, a portion of the lower surface 24 of the first member 21 may not face the upper surface 25 of the second member 22. Alternatively, due to the movement of the second member 22, a state where a portion of the lower surface 24 of the first member 21 does not face the upper surface 25 of the second member 22 may be generated. In this case, the liquid LQ is able to be held between the lower surface 24 and the substrate P (object), and an interface of the liquid LQ (liquid immersion space LS) may be formed between the lower surface 24 and the substrate P (object).

In the present embodiment, the lower surface 24 is substantially parallel to the XY plane. The upper surface 25 is also substantially parallel to the XY plane. The lower surface 26 is also substantially parallel to the XY plane. That is, the lower surface 24 and the upper surface 25 are substantially parallel to each other. The upper surface 25 and the lower surface 26 are substantially parallel to each other.

Moreover, the lower surface 24 may be not parallel to the XY plane and may include a curved surface. Furthermore, the upper surface 25 may not be parallel to the XY plane and may include a curved surface. Moreover, the lower surface 26 may not be parallel to the XY plane and may include a curved surface. Furthermore, one of the lower surface 24, the upper surface 25, and the lower surface 26 may not be parallel to the other one.

The recovery part 23 is disposed outside the lower surface 24 with respect to the optical path K (with respect to an optical axis AX of the terminal optical element 13). In the present embodiment, the substrate P (object) is able to face at least a portion of the recovery part 23. That is, at least a portion of the recovery part 23 is disposed outside of the second member 22 (lower surface 26) with respect to the optical path K (optical axis AX of terminal optical element 13). The recovery part 23 is able to recover at least a portion of the liquid LQ from a first space SP1 which the upper surface 25 faces and a second space SP2 which the lower surface 26 faces. The first space SP1 includes a space between the lower surface 24 and the upper surface 25. That is, the recovery part 23 is capable to recover the liquid LQ which flowed into a space, which is between the lower surface of recovery part 23 and the upper surface 25, from the first space SP1. The second space SP2 includes a space between the lower surface 26 and the upper surface of the substrate P (object). The recovery part 23 is disposed above than the second member 22 (upper surface 25). The recovery part 23 is disposed above than the first space SP1. The recovery part 23 is able to recover the liquid LQ at above the second member 22 (first space SP1). Furthermore, the recovery part 23 is capable to recover the liquid LQ, which flowed into the space between of the recovery part 23 and the upper surface of the substrate P (object) from the first space SP1, along with the liquid LQ from the second space SP2.

Moreover, in the present embodiment, with respect to the direction (Z axis direction) of the optical axis AX of the terminal optical element 13, the size of the first space SP1 is the same as the size of the second space SP2. However, the size of one of two may be smaller than the size of the other one.

In the present embodiment, at least a portion of the second member 22 faces the recovery part 23. In the present embodiment, when the second member 22 is positioned at an origin, a portion of the second member 22 is opposite to the lower surface 24, and other portion (circumferential portion) of the second member 22 is opposite to the recovery part 23. In the present embodiment, when the second member 22 is positioned at the origin, a portion (circumferential portion of the recovery part 23) of the recovery part 23 is disposed outside of the second member 22 (lower surface 26) with respect to the optical path K (optical axis AX). Moreover, the second member 22 may not face the recovery part 23. That is, the upper surface 25 of the second member 22 may not face the recovery part 23 not only the second member 22 is positioned at the origin but also when the second member 22 is moved from the origin. Furthermore, when the second member 22 is positioned at the origin, the second member and the recovery part 23 may not face each other, and the second member 22 and the recovery part 23 may face each other when the second member 22 is moved from the origin. Additionally, in at least a period of a movement period of the second member 22, at least a portion of the recovery part 23 may face the upper surface 25 of the second member 22, and in at least a period of the movement period of the second member 22, the recovery part 23 may not face the upper surface 24 of the second member 22. That is, in at least a period of the movement period of the second member 22, a portion of the recovery part 23 may be disposed outside of the second member 22 (lower surface 26) with respect to the optical path K (optical axis AX), and the entire recovery part 23 may be disposed outside of the second member 22 (lower surface 26) with respect to the optical path K (optical axis Ax). Furthermore, in at least a period of the movement period of the second member 22, a portion of the second member 22 may be disposed outside of the recovery part 23. Moreover, in the present embodiment, the state where the second member 22 is positioned at the origin means a state where an opening 35 (for example, the center of the opening 35) of the second member 22 described below coincides with the optical axis AX of the terminal optical element 13.

In the present embodiment, the recovery part 23 is disposed at the first member 21. Moreover, the recovery part 23 may disposed at a member different from the first member 21 and the second member 22.

The second member 22 is moved by a driving apparatus 27. For example, the driving apparatus 27 includes a motor and moves the second member 22 using the Lorentz force. In the present embodiment, support members 28 are connected to at least a portion of the upper surface 25 of the second member 22. In the present embodiment, the support members 28 are disposed at the +Y axis side and the −Y axis side with respect to the optical path K (terminal optical element 13). The driving apparatus 27 moves the support member 28, and thus, the second member 22 is moved.

Moreover, the arrangement of the plurality of support members 28 is not limited to the +Y axis side and the −Y axis side. For example, the support members may be disposed at the +X axis side and the −X axis side, and may be disposed at the +Y axis side, the −Y axis side, the +X axis side, and the −X axis side. Moreover, the second member 22 may be supported by one support member.

Furthermore, the driving apparatus 27 is supported by the apparatus frame 8B. Thus, even when vibration is generated when the second member 22 is moved, the vibration is not transmitted to the reference frame 8A due to the vibration isolator 10.

In the present embodiment, the first member 21 includes an inner surface 30 which faces a side surface 29 of the terminal optical element 13 and an upper surface 31 which is disposed at a surrounding of an upper end of the inner surface 30. The side surface 29 of the terminal optical element 13 is a non-emitting surface in which the exposure light EL is not emitted. The exposure light EL passes through the emitting surface 12 without passing through the side surface 29.

In the present embodiment, a plurality of support members 28 are arranged so as to move in each of a plurality of holes 32 which are provided in the first member 21. In the present embodiment, the holes 32 are provided in each of the +Y axis side and the −Y axis side with respect to the optical path K. Each of the holes 32 penetrates the first member 21 so as to connect the upper side space (which includes a third space SP3) and the lower side space (which includes the second space SP2) of the first member 21 with respect to the Z axis direction. In the present embodiment, each of the holes 32 is formed so as to connect the inner surface 30 and the lower surface 24 of the first member 21. Moreover, as shown in FIG. 6, each of the holes 32 extends in the X axis direction, and the support member 28 which is disposed at the hole 32 is able to move in the X axis direction. The driving apparatus 27 is connected to the support member 28 in the inner surface 30 side. That is, in the present embodiment, the driving apparatus 27 is connected to the support member 28 directly or indirectly via a separate member in the upper side space of the first member 21. The support member 28 is moved along the X axis direction by the driving apparatus 27, and thus, the second member 22 is moved in the X axis direction.

At least one of the holes 32 in which the support members 28 are disposed may be formed so as to connect the upper surface 31 and the lower surface 24 of the first member 21. Moreover, a plurality of driving apparatuses 27 may be provided, and one support member 28 may be moved by a single driving apparatus, or the plurality of support members 28 may be connected to each other by a connection member (not shown) and the connection member may be moved by a single driving apparatus.

Furthermore, the driving apparatus 27 may be connected to support member 28 between the inner surface 30 (upper surface 31) and the lower surface 24 and may be connected to the support member 28 at the lower surface 24 side.

Moreover, in order to dispose the support member 28, the hole 32 may not be provided in the first member 21. For example, the support member 28 may be disposed at a gap of a plurality of members which configure the first member 21.

In the present embodiment, the second member 22 and the support member 28 do not contact the first member 21. A gap is formed between the first member 21 and the second member 22, and a gap is formed between the first member 21 and the support member 28. The driving apparatus 27 is able to move the second member 22 and the support member 28 so that the second member 22 and the support member 28, and the first member 21 do not contact one another. Moreover, at least one of the second member 22 and the support member 28 does not contact the first member 21.

The liquid immersion member 5 includes a plurality of supply ports 33 which supply the liquid LQ for forming the liquid immersion space LS. The supply ports 33 are disposed inside the recovery part 23 with respect to a radial direction to the optical axis AX (optical path K) of the terminal optical element 13. In the present embodiment, the supply ports 33 are disposed at the first member 21. The supply port 33 is disposed above than the second member 22 (upper surface 25). The supply port 33 is disposed above the first space SP1. The supply port 33 is able to supply the liquid LQ at above the second member 22 (first space SP1). Moreover, the supply ports 33 may be disposed at the second member 22 and may be disposed at both the first member 21 and second member 22.

The inner surface 30 faces the side surface 29 via a gap. The supply ports 33 are disposed so as to face the side surface 29. The supply port 33 is arranged so as to face the third space SP3 between the terminal optical element 13 and the first member 21. The supply ports 33 supply the liquid LQ to the third space SP3 between the side surface 29 and the inner surface 30. In the present embodiment, the supply ports 33 are disposed at each of the +X axis side and the −X axis side with respect to the optical path K (terminal optical element 13). Moreover, the supply ports 33 may be disposed at the Y axis direction with respect to the optical path K (terminal optical element 13), and the plurality of supply ports may be disposed at a surrounding of the optical path K (terminal optical element 13) which includes the X axis direction and the Y axis direction. Moreover, the supply port 33 may be one in number. Moreover, instead of the supply ports 33 or in addition to the supply ports 33, a supply port which is able to supply the liquid LQ may be provided in the lower surface 24. The supply port provided at the lower surface 24 is arranged so as to face the first space SP1 between the lower surface 24 and the upper surface 25. The supply port provided at the lower surface 24 is able to supply the liquid LQ to the first space SP1. At least a portion of the liquid LQ from the supply port, which is provided at the lower surface 24, is supplied to the upper surface 25. The supply port provided at the lower surface 24 is able to supply the liquid LQ at above than the second member 22. The recovery part 23 is able to recover the liquid LQ from the first space SP1. Thus, at least a portion of the liquid LQ, which is supplied from the supply port provided at the lower surface 24, may be recovered from the recovery part 23. The recovery of the liquid LQ from the recovery part 23 may be performed in parallel with at least a part of the supply of the liquid LQ from the supply port provided at the lower surface 24.

The first member 21 includes an opening 34 through which the exposure light EL from the emitting surface 12 is able to pass. The second member 22 includes an opening 35 through which the exposure light EL from the emitting surface 12 is able to pass. In the present embodiment, the size of the opening 34 in the XY plan is larger than the size of the opening 35. In the present embodiment, the size of the opening 34 is larger than the size of the opening 35 in the X axis direction. In the present embodiment, the size of the opening 34 is larger than the size of the opening 35 in the Y axis direction. In the present embodiment, the first member 21 is not disposed immediately under the emitting surface 12 and the opening 34 is disposed at a surrounding of the emitting surface 12. In the present embodiment, the opening 34 is larger than the emitting surface 12. In the present embodiment, the lower end of the gap which is formed between the side surface 29 of the terminal optical element 13 and the first member 21 faces the upper surface 25 of the second member 22. Moreover, the opening 35 of the second member 22 is disposed so as to face the emitting surface 12. In the present embodiment, the shape of the opening 35 in the XY plane is a rectangular shape which is long in the X axis direction. Moreover, the shape of the opening 35 is not limited to the rectangular shape, and may be an elliptical shape which is long in the X axis direction and a polygonal shape which is long in the X axis direction.

The first member 21 includes an upper surface 36 which is connected to the lower end of the inner surface 30 and is toward the opposite direction (+Z axis direction) of the lower surface 24. The upper surface 36 is disposed at a surrounding of the upper end of the opening 34. The lower surface 24 is disposed at a surrounding of the lower end of the opening 34. The upper surface 25 is disposed at a surrounding of the upper end of the opening 35. The lower surface 26 is disposed at a surrounding of the lower end of the opening 35.

After the liquid LQ supplied from the supply ports 33 flows to the upper surface 36, the liquid LQ is supplied to the upper surface 25. At least a portion of the liquid LQ supplied to the upper surface 25 is supplied onto the substrate P (object) via the opening 35 which is provided in the second member 22. Thereby, the optical path K is filled with the liquid LQ. Moreover, at least a portion of the liquid LQ from the opening 35 is supplied to the second space SP2.

Furthermore, at least a portion of the liquid LQ supplied to the upper surface 25 from the supply ports 33 is supplied to the first space SP1 via an opening 40. Moreover, when the supply port which faces the first space SP1 is arranged, the liquid LQ from the supply port 33, which faces the third space SP3, may not flow into the first space SP1.

The supply ports 33 are connected to a liquid supply apparatus via a supply channel 33R which is formed in the inner portion of the first member 21. The supply ports 33 supply the liquid LQ from the liquid supply apparatus in order to form the liquid immersion space LS.

At least a portion of the recovery part 23 is disposed so as to face the substrate P (object). Moreover, at least a portion of the recovery part 23 is disposed so as to face the second member 22. The recovery part 23 includes recovery ports 37 for recovering the liquid LQ. The recovery ports 37 are connected to a liquid recovery apparatus (not shown) via a recovery channel (space) 37R which is formed in the inner portion of the first member 21. The liquid recovery apparatus is able to be connected to the recovery ports 37 and a vacuum system (not shown). The recovery ports 37 is able to recover at least a portion of the liquid LQ of the liquid immersion space LS. At least a portion of the liquid LQ on the substrate P (object) is able to flow into the recovery channel 37R via the recovery ports 37. At least a portion of the liquid LQ of the first space SP1 is able to flow into the recovery channel 37R via the recovery ports 37. Moreover, at least a portion of the liquid LQ of the second space SP2 is able to flow into the recovery channel 37R via the recovery ports 37.

In the present embodiment, the recovery part 23 includes a porous member 38. In the present embodiment, the recovery ports 37 include holes of the porous member 38. In the present embodiment, the porous member 38 includes a mesh plate. The porous member 38 includes a lower surface 39 which the substrate P (object) is able to face, an upper surface which faces the recovery channel 37R, and the plurality of holes which connect the lower surface 39 and the upper surface. The liquid LQ on the substrate P (object) which is recovered from the recovery ports 37 (holes of the porous member 38) flows into the recovery channel 37R.

In the present embodiment, the lower surface of the recovery part 23 includes the lower surface 39 of the porous member 38. The lower surface 39 is disposed at a surrounding of the lower surface 24. In the present embodiment, the lower surface 39 of the recovery part 23 is substantially parallel to the XY plane.

In the present embodiment, the second member 22 is able to face the entire lower surface 24. For example, as shown in FIGS. 2 and 3, when the second member 22 is positioned at the origin where the optical axis AX of the terminal optical element 13 and the center of the opening 35 sub- stantially coincide with each other, the entire lower surface 24 faces the upper surface 25 of the second member 22, and a portion of the recovery part 23 (lower surface 39) faces the upper surface 25 of the second member 22. Moreover, in the present embodiment, when the second member 22 is positioned at the origin, the center of the opening 34 and the center of the opening 35 substantially coincide with each other. Furthermore, in the present embodiment, when the second member 22 is positioned at the origin, a first portion 391 of the recovery part 23 (lower surface 39) close to the optical path K faces the second member 22 (upper surface 25), and a second portion 392 of the recovery part 23 (lower surface 39) outside the first portion 391 with respect to the optical path K does not face the second member 22 (upper surface 25). That is, in the present embodiment, when the second member 22 is positioned at the origin, the inner edge (first portion 391) of the lower surface 39 is capable to face the upper surface 25 of the second member 22, and the second portion 392 which is a surrounding of the first portion 391 of the lower surface 39 is capable to face the substrate P (object).

Moreover, at least a portion of the second member 22 (upper surface 25) faces the emitting surface 12.

Furthermore, in the present embodiment, an opening 40 is formed between the inner edge of the lower surface 24 and the upper surface 25. A fourth space SP4 which includes the optical path K between the emitting surface 12 and the substrate P (object) and the first space SP1 between the lower surface 24 and the upper surface 25 are connected to each other via the opening 40. In the present embodiment, the fourth space SP4 includes the space between the emitting surface 12 and the substrate P (object) and the space between the emitting surface 12 and the upper surface 25. The opening 40 is disposed so as to face the optical path K.

In the present embodiment, since the recovery operation of the liquid LQ from the recovery part 23 (recovery ports 37) is performed in parallel with the supply operation of the liquid LQ from the supply ports 33, the liquid immersion space LS is formed between the terminal optical element 13 and the liquid immersion member 5 of one side and the substrate P (object) of the another side, by the liquid LQ.

A portion of an interface LG of the liquid LQ of the liquid immersion space LS is formed between the liquid immersion member 5 and the substrate P (object). For example, it the present embodiment, in FIGS. 2, 3, and 4, the interface LG is formed between the first member 21 and the substrate P (object).

Moreover, in the present embodiment, at least a portion of the third space SP3 is filled with the liquid LQ of the liquid immersion space LS. A portion of the interface LG of the liquid LQ is formed between the terminal optical element 13 and the first member 21.

In descriptions below, the interface LG of the liquid LQ which is formed between the first member 21 and the substrate P (object) is appropriately referred to as a first interface LG1, and the interface LG of the liquid LQ which is formed between the first member 21 and the terminal optical element 13 is appropriately referred to as a second interface LG2. Furthermore, as described below, in the state where the liquid immersion space LS is formed, the interface of the liquid LQ may be formed between the first member 21 and the upper surface 25 of the second member 22, and the interface of the liquid LQ may be formed between the lower surface 26 of the second member 22 and the substrate P (object).

The second member 22 is able to move with respect to the first member 21. Moreover, the second member 22 is able to move with respect to the terminal optical element 13. That is, in the present embodiment, the relative position between the second member 22 and the first member 21 may change. The relative position between the second member 22 and the terminal optical element 13 may change.

The second member 22 is able to move in the X axis direction. The second member 22 is able to move to be substantially parallel to the XY plane. Moreover, the second member 22 is able to move in at least one direction of the Y axis, the Z axis, the θX, the θY, and the θZ axis directions, in addition to the X axis direction.

In the present embodiment, the terminal optical element 13 does not substantially move. The first member 21 also does not substantially move.

The second member 22 is able to move to the lower portion of at least a portion of the first member 21. The second member 22 is able to move between the first member 21 and the substrate P (object).

In the present embodiment, the second member 22 is able to move in parallel with at least a portion of the movement of the substrate P (object). Moreover, in the present embodiment, the second member 22 is able to move in a state where the liquid immersion space LS is formed. Furthermore, the second member 22 is able to move in a state where the liquid LQ is present in the first space SP1 and the second space SP2. Moreover, the second member 22 is able to move in cooperation with the movement of the substrate P (object) and is able to move independently of the substrate P (object).

Furthermore, the second member 22 may move when the second member 22 and the substrate P (object) do not face each other. For example, the second member 22 may move when the object is not present under the second member 22. Moreover, the second member 22 may move when the liquid LQ is not present in the space between the second member 22 and the substrate P (object). For example, the second member 22 may move when the liquid immersion space LS is not formed.

For example, the second member 22 may move based on the movement conditions of the substrate P (object). For example, the controller 6 moves the second member 22 in parallel with at least a portion of the movement of the substrate P (object) based on the movement conditions of the substrate P (object). The controller 6 moves the second member 22 while performing the supply of the liquid LQ from the supply ports 33 and the recovery of the liquid LQ from the recovery ports 37 so that the liquid immersion space LS is formed and is continuous.

In the present embodiment, the second member 22 is able to move so that the relative movement between the second member 22 and the substrate P (object) is decreased. Moreover, the second member 22 is able to move so that the relative movement between the second member and the substrate P (object) is smaller than the relative movement between the first member 21 and the substrate P (object). For example, the second member 22 may move in synchronization with the substrate P (object).

The relative movement includes at least one of a relative speed and a relative acceleration. For example, in a state where the liquid immersion space LS is formed, that is, in a state where the liquid LQ is present in the second space SP2, the second member 22 may move so that the relative speed between the second member 22 and the substrate P (object) is decreased. Moreover, in the state where the liquid immersion space LS is formed, that is, in the state where the liquid LQ is present in the second space SP2, the second member 22 may move so that the relative acceleration between the second member and the substrate P (object) is decreased.

Furthermore, in the state where the liquid immersion space LS is formed, that is, in the state where the liquid LQ is present in the second space SP2, the second member 22 may move so that the relative speed between the second member and the substrate P (object) is smaller than the relative speed between the first member 21 and the substrate P (object). Moreover, in the state where the liquid immersion space LS is formed, that is, in a state where the liquid LQ is present in the second space SP2, the second member 22 may move so that the relative acceleration between the second member and the substrate P (object) is smaller than the relative acceleration between the first member 21 and the substrate P (object).

For example, the second member 22 is able to move in the movement direction of the substrate P (object). For example, when the substrate P (object) moves in the +X axis direction (or the −X axis direction), the second member 22 is able to move in the +X axis direction (or the −X axis direction). Moreover, when the substrate P (object) moves in the +Y axis direction (or the −Y axis direction) while moving in the +X axis direction, the second member is able to move in the +X axis direction. Furthermore, when the substrate P (object) moves in the +Y axis direction (or the −Y axis direction) while moving in the −X axis direction, the second member 22 is able to move in the −X axis direction. That is, in the present embodiment, when the substrate P (object) moves in the direction which includes the component of the X axis direction, the second member 22 in capable to move in the X axis direction. Furthermore, when the second member 22 is able to move in the Y axis direction, the second member 22 may move in the Y axis direction in parallel with at least a portion of the movement which includes the component of the Y axis direction of the substrate P (object).

Figure 7:
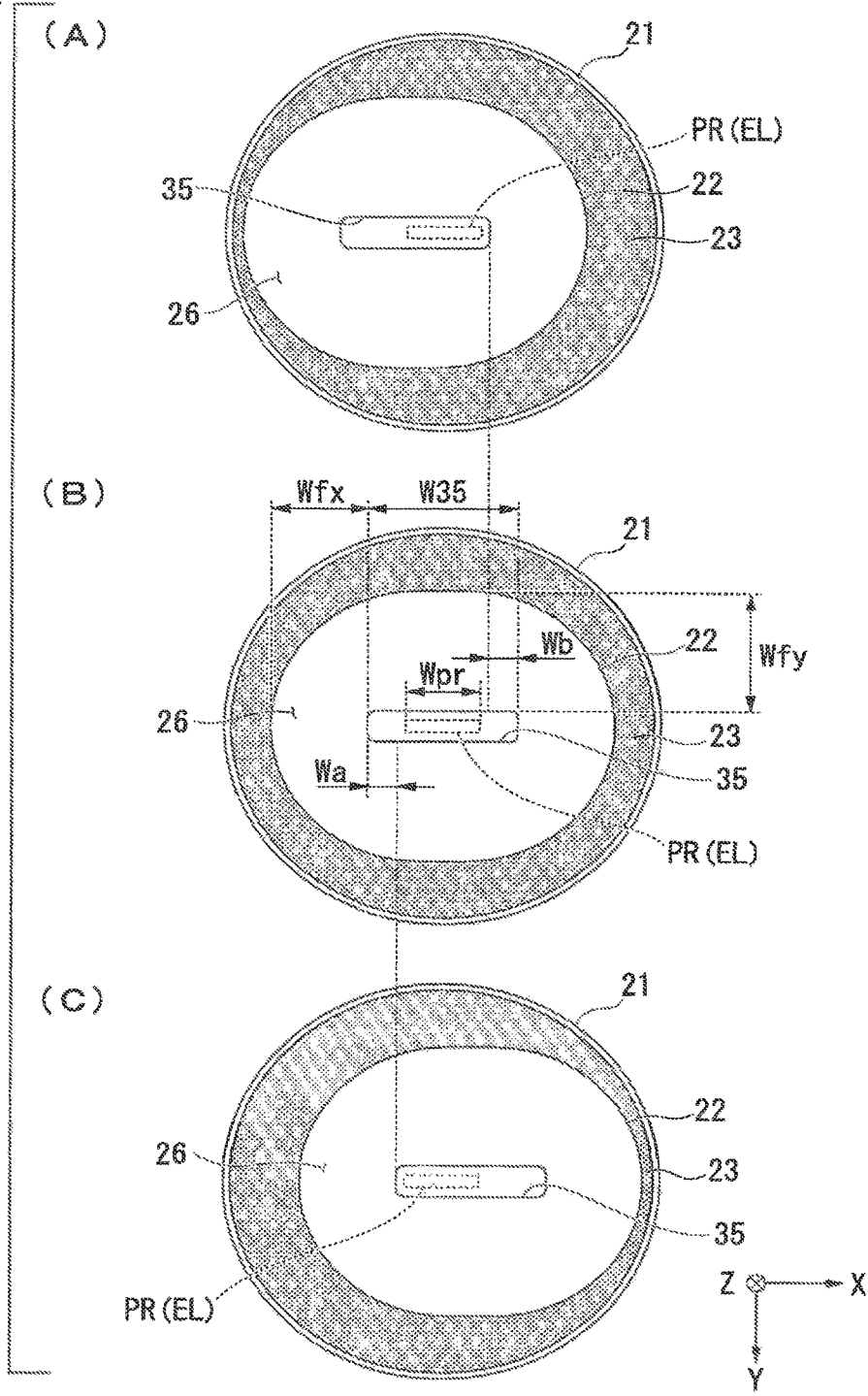
FIG. 7 is a view showing an example of an operation of the liquid immersion member according to the first embodiment.

FIG. 7 shows an example of a state where the second member 22 moves. FIG. 7 is a view when the liquid immersion member 5 is viewed from below (−Z axis side).

In descriptions below, the second member 22 moves in the X axis direction. Moreover, as described above, the second member 22 may move in the Y axis direction and may move in an arbitrary direction in the XY plane which includes the component of the X axis direction (or the Y axis direction).

When the substrate P (object) moves in the X axis direction (or a predetermined direction in the XY plane which includes the component of the X axis direction), as shown in FIGS. 7(A) to 7(C), the second member 22 moves in the X axis direction.

In the present embodiment, the second member 22 is able to move in a movable range which is defined with respect to the X axis direction. FIG. 7(A) shows a state where the second member 22 is disposed at the furthest end of the −X axis side of the movable range. FIG. 7(B) shows a state where the second member 22 is disposed at the center of the movable range. FIG. 7(C) shows a state where the second member 22 is disposed at the furthest end of the +X axis side of the movable range.

In descriptions below, the position of the second member 22 shown in FIG. 7(A) is appropriately referred to as a first end position, the position of the second member 22 shown in FIG. 7(B) is appropriately referred to as a center position, and the position of the second member 22 shown in FIG. 7(C) is appropriately referred to as a second end position. Moreover, the center position of FIG. 7(B) is the position when the second member 22 is positioned at the origin.

In the present embodiment, the size of the opening 35 is determined based on the size of the movable range of the second member 22 so that the exposure light EL from the emitting surface 12 passes through the opening 35. In the present embodiment, the size of the movable range of the second member 22 includes the distance between the first end position and the second end position with respect to the X axis direction. The size in the X axis direction of the opening 35 is determined so that, even when the second member 22 moves in the X axis direction, the exposure light EL from the emitting surface 12 is not radiated to the second member 22.

In FIG. 7, the size W35 of the opening 35 with respect to the X axis direction is larger than the sum of the size Wpr of the exposure light EL (projection region PR) and the size (Wa+Wb) of the movable range of the second member 22. The size W35 is determined as the distance over which, even when the second member 22 moves between the first end position and the second end position, the exposure light EL from the emitting surface 12 is not blocked. Thereby, even when the second member 22 moves, the exposure light EL from the emitting surface 12 is not blocked by the second member 22 and is able to be radiated to the substrate P (object).

Figure 8:
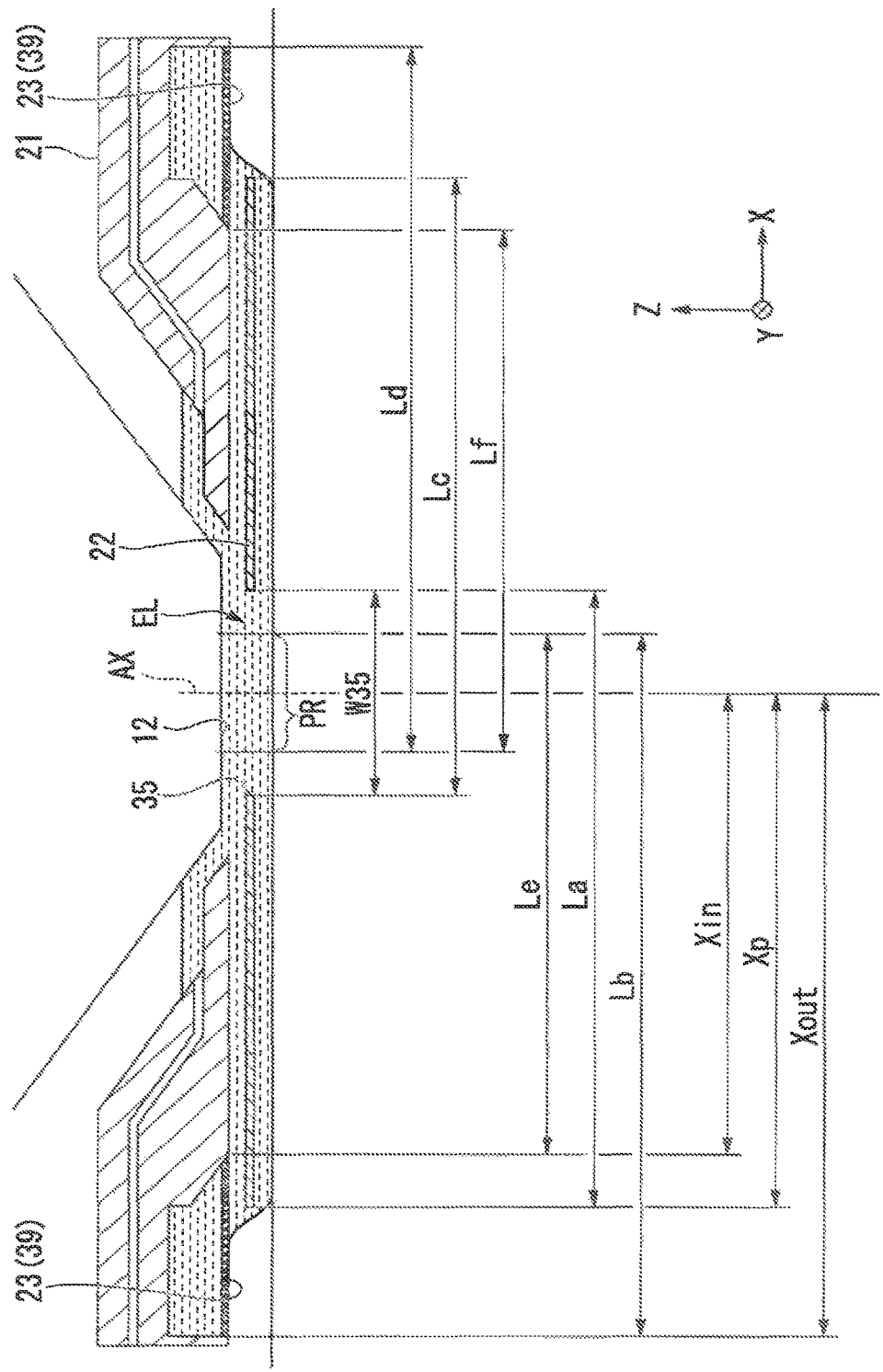
FIG. 8 is a view showing an example of the liquid immersion member according to the first embodiment.

Moreover, as shown in FIG. 8, in the present embodiment, with respect to the X axis direction, a distance La between the +X axis side end of the opening 35 and the −X axis side end of the second member 22 is smaller than a distance Lb between the +X axis side end of the optical path K of the exposure light EL and the −X axis side end of the recovery part 23 (lower surface 39) which is disposed at the −X axis side with respect to the optical path K of the exposure light EL. Thereby, even when the second member 22 is disposed at the first end position, the exposure light EL from the emitting surface 12 is not blocked by the second member 22 and is able to be radiated to the substrate P (object). Moreover, even when the second member 22 is disposed at the first end position, a portion of the lower surface 39 faces the second member 22, and a portion of the lower surface 39 does not face the second member 22.

Moreover, as shown in FIG. 8, in the present embodiment, with respect to the X axis direction, a distance Lc between the −X axis side end of the opening 35 and the +X axis side end of the second member 22 is smaller than a distance Ld between the −X axis side end of the optical path K of the exposure light EL and the +X axis side end of the recovery part 23 (lower surface 39) which is disposed at the +X axis side with respect to the optical path K of the exposure light EL. Thereby, even when the second member 22 is disposed at the second end position, the exposure light EL from the emitting surface 12 is not blocked by the second member 22 and is able to be radiated to the substrate P (object). Moreover, even when the second member 22 is disposed at the second end position, a portion of the lower surface 39 faces the second member 22, and a portion of the lower surface 39 does not face the second member 22.

Furthermore, with respect to the X axis direction, the size W35 is smaller than a distance Le between the +X axis side end of the optical path K of the exposure light EL and the +X axis side end of the recovery part 23 (lower surface 39) which is disposed at the −X axis side with respect to the optical path K of the exposure light EL. Thereby, even when the second member 22 is disposed at the first end position, the exposure light EL from the emitting surface 12 is not blocked by the second member 22, is able to be radiated to the substrate P (object), and the +X axis side end of the recovery part 23 (lower surface 39) which is disposed at the −X axis side with respect to the optical path K continuously faces the second member 22.

Moreover, with respect to the X axis direction, the size W35 is smaller than a distance Lf between the −X axis side end of the optical path K of the exposure light EL and the −X axis side end of the recovery part 23 (lower surface 39) which is disposed at the +X axis side with respect to the optical path K of the exposure light EL. Thereby, even when the second member 22 is disposed at the second end position, the exposure light EL from the emitting surface 12 is not blocked by the second member 22, is able to be radiated to the substrate P (object), and the −X axis side end of the recovery part 23 (lower surface 39) which is disposed at the axis side with respect to the optical path K continuously faces the second member 22.

Furthermore, in the state where the optical axis AX of the terminal optical element 13 and the center of the opening 35 coincide with each other, that is, in the state where the second member 22 is disposed at the origin (center position), with respect to the X axis direction, an expression (1) shown below is satisfied when a distance between the center of the opening 35 and the outside end of the second member 22 is set to Xp, a distance between the optical axis AX of the terminal optical element 13 and the inside end of the recovery part 23 (lower surface 39) is set to Xin, and a distance between the optical axis AX of the terminal optical element 13 and the outside end of the recovery part 23 (lower surface 39) is set to Xout.

$$Xin < Xp < Xout \qquad \text{Expression (1)}$$

Moreover, in the state where the optical axis AX of the terminal optical element 13 and the center of the opening 35 coincide with each other, that is, in the state where the second member 22 is disposed at the origin (center position), with respect to the Y axis direction, an expression (2) shown below is satisfied when a distance between the center of the opening 35 and the outside end of the second member is set to Yp, a distance between the optical axis AX of the terminal optical element 13 and the inside end of the recovery part 23 (lower surface 39) is set to Yin, and a distance between the optical axis AX of the terminal optical element 13 and the outside end of the recovery part 23 (lower surface 39) is set to Yout.

$$Yin \leq Yp < Yout \qquad \text{Expression (2)}$$

Furthermore, the recovery part 23 may include the porous member 38 and the porous member 38 may not be present. Moreover, when the recovery part 23 does not include the porous member 38 and includes the plurality of recovery ports which are disposed so as to enclose the optical path K, the inside end of the recovery part 23 includes virtual lines which connect the inside edges of the plurality of recovery ports, and the outside end of the recovery part 23 includes virtual lines which connect the outside edges of the plurality of recovery ports. The inside edges of the recovery ports are edges nearest to the optical path K with respect to the radial direction to the optical path K. The outside edges of the recovery ports are edges farthest from the optical path K with respect to the radial direction to the optical path K.

Moreover, in the present embodiment, when the second member 22 is positioned at the origin, the lower surface 24 of the first member 21 and the entire of the recovery part 23 (lower surface 39) may be opposite to the upper surface 25 of the second member 22. For example, an outline of the second member 22 in the XY plane may be larger than an outline of the recovery part 23. In the relative positional relationship between the first member 21 and the second member 22 when the second member 22 is positioned at the origin, at least a portion of the second member 22 when viewed in the +Z axis direction may be disposed outside of the recovery part 23, and the outline of the second member 22 and the outline form of the recovery part 23 may be substantially same. Moreover, in the state where the second member 22 is disposed at the origin, the second member 22 may not be arranged outside of the recovery part 23 when viewed in +Z axis direction, and in at least a period of the movement period of the second member 22 with in the movable range, at least a portion of the second member 22 may be arranged outside of the recovery part 23. For example, in the state where the second member 22 is disposed at the origin, the second member 22 may not be arranged outside of the recovery part 23 when viewed in +Z axis direction, and in a state where the second member 22 is disposed at one or both of the first end position and the second end position, at least a portion of the second member 22 may be arranged outside of the first member 21.

Next, a method for exposing the substrate P using the exposure apparatus EX including the above-described configuration will be described.

In a substrate exchange position away from the liquid immersion member 5, processing which carries (loads) the substrate P before the exposure in the substrate stage 2 (first holding portion) is perforated. Moreover, in at least a part of a period in which the substrate stage 2 is away from the liquid immersion member 5, the measurement stage 3 is disposed so as to face the terminal optical element 13 and the liquid immersion member 5. The controller 6 performs the supply of the liquid LQ from the supply ports 33 and the recovery of the liquid LQ front the recovery part 23 (recovery ports 37), and the liquid immersion space LS is formed at the measurement stage 3.

After the substrate P before the exposure is loaded on the substrate stage 2 and the measurement processing using the measurement stage 3 is terminated, the controller 6 moves the substrate stage 2 so that the terminal optical element 13 and the liquid immersion member 5 face the substrate stage 2 (substrate P). In the state where the terminal optical element 13 and the liquid immersion member 5 face the substrate stage 2 (substrate P), the recovery of the liquid LQ from the recovery ports 37 is performed in parallel with the supply of the liquid LQ from the supply ports 33, and thus, the liquid immersion space LS is formed between the terminal optical element 13 and the liquid immersion member 5, and the substrate stage 2 (substrate P) so that the optical path K is filled with the liquid LQ.

The controller 6 starts the exposure processing of the substrate P. In the state where the liquid immersion space LS is formed on the substrate P, the controller 6 emits the exposure light EL from the illumination system IL. The illumination system IL illuminates the mask M with the exposure light EL. The exposure light EL from the mask M is radiated to the substrate P via the liquid LQ of the liquid immersion space LS between the projection optical system PL and the emitting surface 12, and the substrate P. Thereby, the substrate P is exposed by the exposure light EL which is emitted from the emitting surface 12 via the liquid LQ of the liquid immersion space LS, and the image of the pattern of the mask M is projected to the substrate P.

The exposure apparatus EX of the present embodiment is a scanning type exposure apparatus (a so-called scanning stepper) in which the mask M and the substrate P synchronously move in a predetermined scanning direction and the image of the pattern of the mask M is projected to the substrate P. In the present embodiment, the scanning direction of the substrate P (synchronous movement direction) is set to the Y axis direction, and the scanning direction (synchronous movement direction) of the mask M is also set to the Y axis direction. The controller 6 radiates the exposure light EL to the substrate P via the liquid LQ of the liquid immersion space LS on the projection optical system PL and the substrate P while moving the substrate P in the Y axis direction with respect to the projection region PR of the projection optical system PL and moving the mask M in the Y axis direction with respect to the illumination region IR of the illumination system IL in synchronization with the movement in the Y axis direction of the substrate P.

Figure 9:
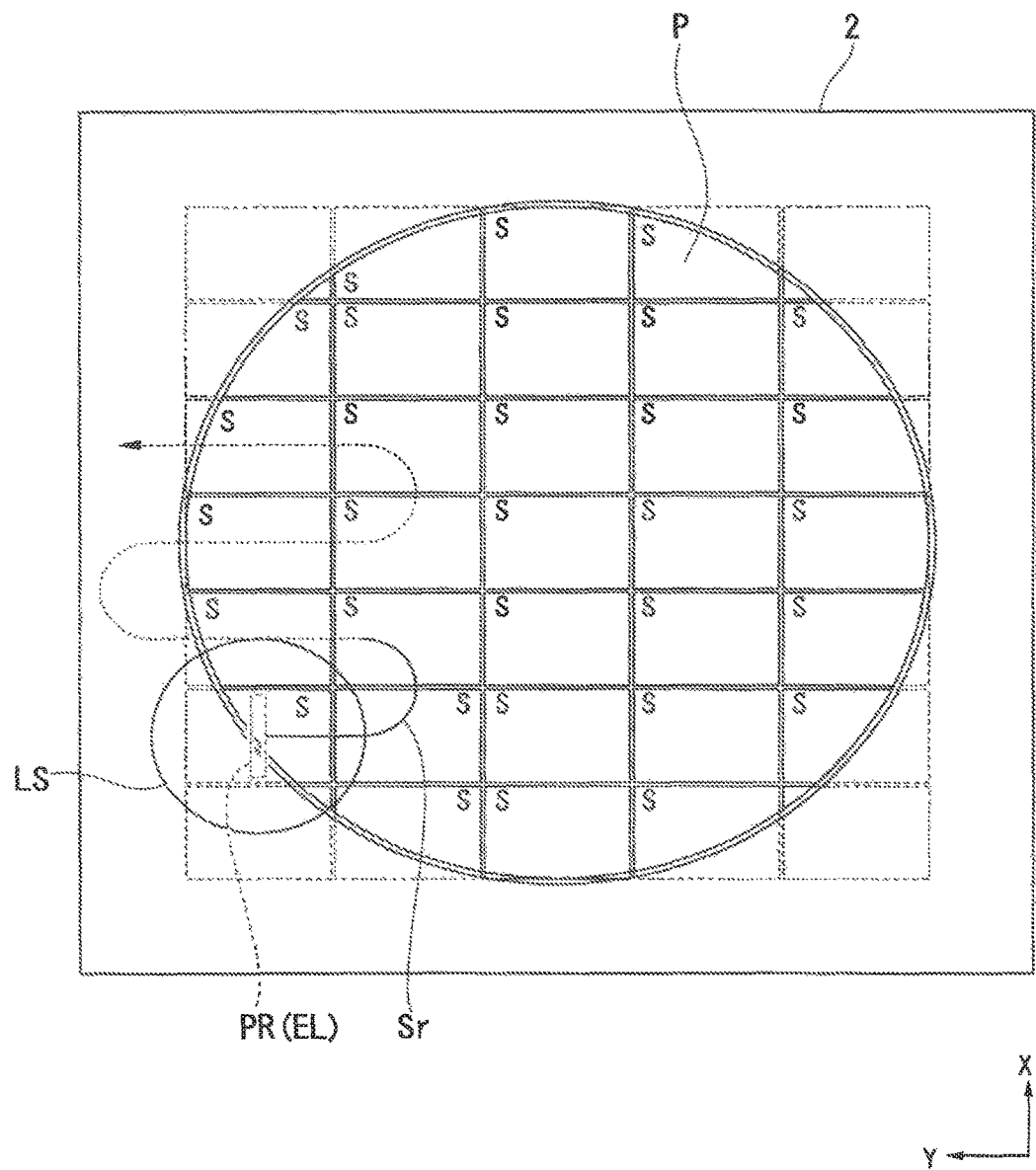
FIG. 9 is a view for explaining an example of an operation of an exposure apparatus according to the first embodiment.

FIG. 9 is a view showing an example of the substrate P which is held by the substrate stage 2. In the present embodiment, a plurality of shot region S, which are regions to be exposed on the substrate P, is arranged in a matrix form. The controller 6 sequentially exposes the plurality of shot region S of the substrate P, which is held by the first holding portion, via the liquid LQ of the liquid immersion space LS by the exposure light EL.

For example, in order to expose the first shot region S of the substrate P, in the state where the liquid immersion space LS is formed, the controller 6 radiates the exposure light EL to the first shot region S via the liquid LQ of the liquid immersion space LS on the projection optical system PL and the substrate P while moving the substrate P (first shot region S) in the Y axis direction with respect to the projection region PR of the projection optical system PL, and moving the mask M in the Y axis direction with respect to the illumination region IR of the illumination system IL in synchronization with the movement in the Y axis direction of the substrate P. Thereby, the image of the pattern of the mask M is projected to the first shot region S of the substrate P, and the first shot region S is exposed by the exposure light EL which is emitted from the emitting surface 12. After the exposure of the first shot region S is terminated, in order to start the exposure of a next second region S, in the state where the liquid immersion space LS is formed, the controller 6 moves the substrate P in the direction (for example, X axis direction, directions which are inclined with respect to the X axis direction and Y axis direction in the XY plane, or the like) which intersects the X axis in the XY plane, and moves the second shot region S to an exposure starting position. Thereafter, the controller 6 starts the exposure of the second shot region S.

The controller 6 repeats the operation which exposes the shot region while moving the shot region in the Y axis direction with respect to the position (projection region PR) irradiated with the exposure light EL from the emitting surface 12 in the state where the liquid immersion space LS is formed on the substrate P (substrate stage 2), and after the exposure of the shot region, the operation which moves the substrate P in the direction (for example, X axis direction, directions which are inclined with respect to the X axis direction and Y axis direction in the XY plane, or the like) which intersects the Y axis direction in the XY plane so that the next shot region is disposed at the exposure start position in the state where the liquid immersion space LS is formed on the substrate P (substrate stage 2), and the controller sequentially exposes the plurality of shot regions of the substrate P.

In descriptions below, the operation, which moves the substrate P (shot region) in the Y axis direction with respect to the position (projection region PR) irradiated with the exposure light EL from the emitting surface 12 in the state where the liquid immersion space LS is formed on the substrate P (substrate stage 2) in order to expose the shot region, is appropriately referred to as a scan movement operation. Moreover, the operation, which moves the substrate P in the XY plane before the exposure of the next shot region starts in the state where the liquid immersion space LS is formed on the substrate P (substrate stage 2) after the exposure of a predetermined shot region is completed, is appropriately referred to as a step movement operation.

In the scan movement operation, the exposure light EL is emitted from the emitting surface 12. The exposure light EL is radiated to the substrate P (object). In the step movement operation, the exposure light EL is not emitted from the emitting surface 12. The exposure light EL is not radiated to the substrate P (object).

The controller 6 sequentially exposes the plurality of shot regions S of the substrate P while repeating the scan movement operation and the step movement operation. Moreover, the scan movement operation is an equal speed movement only with respect to the Y axis direction. The step movement operation includes acceleration and deceleration movement. For example, the step movement operation between two shot regions adjacent in the X axis direction includes the acceleration and deceleration movement with respect to the Y axis direction and the acceleration and deceleration movement with respect to the X axis direction.

Moreover, at least a portion of the liquid immersion space LS may be formed on the substrate stage 2 (cover member T) in at least a portion of the scan movement operation and the step movement operation.

The controller 6 controls the driving system 15 based on exposure conditions of the plurality of shot regions S on the substrate P and moves the substrate P (substrate stage 2). For example, the exposure conditions of the plurality of shot regions S are defined by exposure control information referred to as an exposure recipe. The exposure control information is stored in the storage part 7. The controller 6 sequentially expose the plurality of shot regions S while moving the substrate P by a predetermined condition based on the exposure conditions stored in the storage part 7. The movement conditions of the substrate P (object) include at least one of the movement speed, the acceleration and deceleration, the movement distance, the movement direction, and the movement locus in the XY plane.

As an example, the controller 6 radiates the exposure light EL to the projection region PR while moving the substrate stage 2 so that the projection region PR of the projection optical system PL and the substrate P move along the movement locus shown by an arrow Sr in FIG. 9, and sequentially exposes the plurality of shot regions S of the substrate P via the liquid LQ by the exposure light EL.

Hereinafter, the above-described processing is repeated, and thus, a plurality of substrates P is sequentially exposed.

In the present embodiment, the second member 22 moves in at least a portion of the exposure processing of the substrate P. For example, the second member 22 moves in parallel with at least a portion of the step movement operation of the substrate P (substrate stage 2) in the state where the liquid immersion space LS is formed. In addition, in the present embodiment, for example, the second member 22 moves in parallel with at least a portion of the scan movement operation of the substrate P (substrate stage 2) in the state where the liquid immersion space LS is formed. That is, the exposure light EL is emitted from the emitting surface 12 in parallel with the movement of the second member 22. In addition, the second member 22 may not move during the scan movement operation. That is, the second member 22 may not move in parallel with the emission of the exposure light EL from the emitting surface 12. For example, the second member 22 may move so that the relative movement (relative speed, relative acceleration) between the second member and the substrate P (substrate stage 2) is decreased when the substrate P (substrate stage 2) performs the step movement operation. In addition, the second member 22 may move so that the relative movement (relative speed, relative acceleration) between the second member and the substrate P (substrate stage 2) is decreased when the substrate P (substrate stage 2) performs the scan movement operation.

Figure 10:
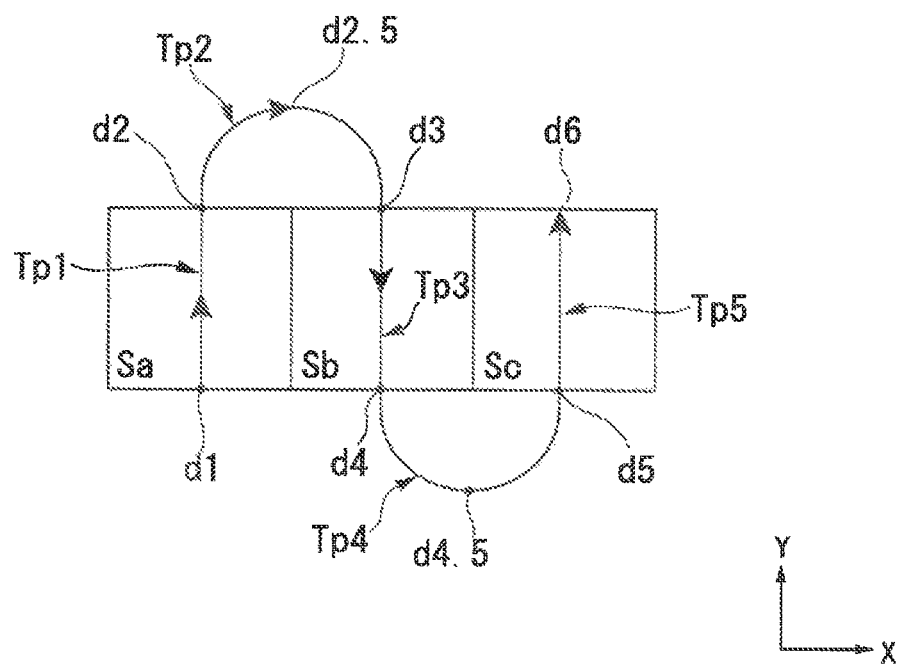
FIG. 10 is a schematic view for explaining an example of the operation of the exposure apparatus according to the first embodiment.

FIG. 10 is a view schematically showing an example of the movement locus of the substrate P when sequentially exposing a shot region Sa, a shot region Sb, and a shot region Sc while performing the step movement which includes the components in the +X axis direction to the substrate P.

As shown in FIG. 10, when the shot regions Sa, Sb, and Sc are exposed, the substrate P sequentially moves a pathway Tp1 from a position d1 to a position d2 adjacent at the +Y axis side with respect to the position d1, a pathway Tp2 from the position d2 to a position d3 adjacent at the +X axis side with respect to the position d2, pathway Tp3 from the position d3 to a position d4 adjacent at the −Y axis side with respect to the position d3, a pathway Tp4 from the position d4 to a position d5 adjacent at the +X axis side with respect to the position d4, and a pathway Tp5 from the position d5 to a position d6 adjacent at the +Y axis side with respect to the position d5 under the terminal optical element 13. The positions d1, d2, d3, d4, d5, and d6 are positions in the XY plane.

At least a portion of the pathway Tp1 is a straight line parallel to the Y axis. At least a portion of the pathway Tp3 is a straight line parallel to the Y axis. At least a portion of the pathway Tp5 is a straight line parallel to the Y axis. The pathway Tp2 includes a curved line passing through a position d2. 5. The pathway Tp4 includes a curved line passing through a position d4. 5. The position d1 includes the start point of the pathway Tp1, and the position d2 includes the end point of the pathway Tp1. The position d2 includes the start point of the pathway Tp2, and the position d3 includes the end point of the pathway Tp2. The position d3 includes the start point of the pathway Tp3, and the position d4 includes the end point of the pathway Tp3. The position d4 includes the start point of the pathway Tp4, and the position d5 includes the end point of the pathway Tp4. The position d5 includes the start point of the pathway Tp5, and the position d6 includes the end point of the pathway Tp5. The pathway Tp1 is a pathway on which the substrate P moves in the +Y axis direction. The pathway Tp3 is a pathway on which the substrate P moves in the −Y axis direction. The pathway Tp5 is a pathway on which the substrate P moves in the +Y axis direction. The pathway Tp2 and the pathway Tp4 are pathways on which the substrate P moves in the direction which has the +X axis direction as the main component.

When the substrate P moves the pathway Tp1 in the state where the liquid immersion space LS is formed, the exposure light EL is radiated to the shot region Sa via the liquid LQ. The operation in which the substrate P moves the pathway Tp1 includes the scan movement operation. When the substrate P moves the pathway Tp3 in the state where the liquid immersion space LS is formed, the exposure light EL is radiated to the shot region Sb via the liquid EQ. The operation in which the substrate P moves the pathway Tp3 includes the scan movement operation. When the substrate P moves the pathway Tp5 in the state where the liquid immersion space LS is formed, the exposure light EL is radiated to the shot region Sc via the liquid LQ. The operation in which the substrate P moves the pathway Tp5 includes the scan movement operation. In addition, the operations in which the substrate P moves the pathway Tp2 and the pathway Tp4 include the step movement operation. When the substrate P moves the pathway Tp2 and the pathway Tp4, the exposure light EL is not radiated.

Figure 11:
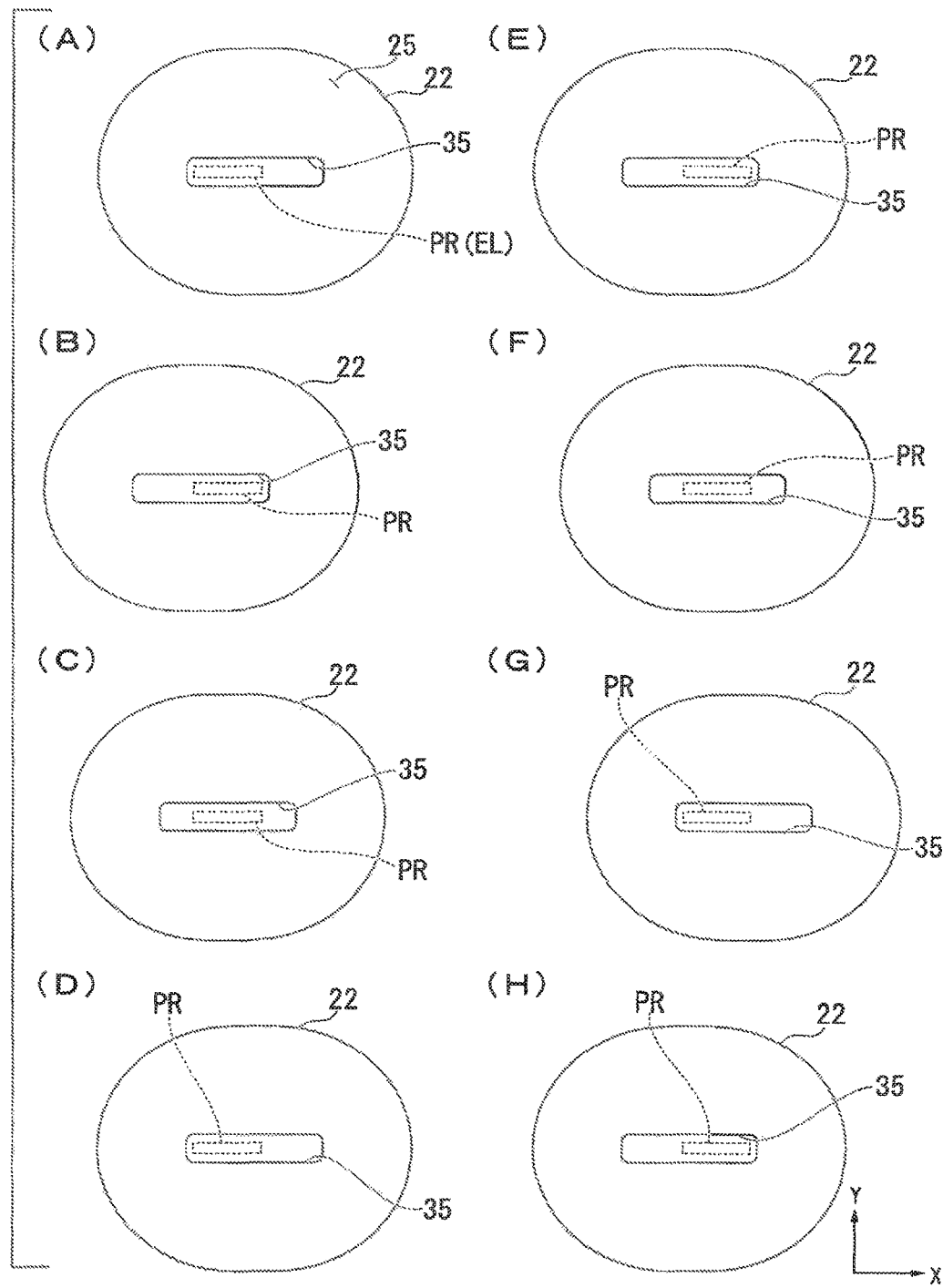
FIG. 11 is a schematic view for explaining an example of the operation of the liquid immersion member according to the first embodiment.

FIG. 11 is a schematic view showing an example of the operation of the second member 22. FIG. 11 is a view when the second member 22 is viewed from the upper surface 25 side. When the substrate P is positioned at the position d1 in FIG. 10, the second member 22 is disposed at the position shown in FIG. 11(A) with respect to the projection region PR (the optical path K of the exposure light EL). When the substrate P is positioned at the position d2, the second member 22 is disposed at the position shown in FIG. 11(B) with respect to the projection region PR (the optical path K of the exposure light EL). That is, during the scan operation movement of the substrate P from the position d1 to the position d2. The second member 22 moves in the −X axis direction, which is reverse to the direction (+X axis direction) of the step movement of the substrate P. When the substrate P is positioned at the position d2. 5, the second member 22 is disposed at the position shown in FIG. 11(C) with respect to the projection region PR (the optical path K of the exposure light EL). When the substrate P is positioned at the position d3, the second member 22 is disposed at the position shown in FIG. 11(D) with respect to the projection region PR (the optical path K of the exposure light EL). That is, during the stepping operation movement of the substrate P from the position d2 to the position d3, the second member 22 moves in the +X axis direction, which is the same as the direction (+X axis direction) of the step movement of the substrate P. When the substrate P is positioned at the position d4, the second member 22 is disposed at the position shown in FIG. 11(E) with respect to the projection region PR (the optical path K of the exposure light EL). That is, during the scan operation movement of the substrate P from the position d3 to the position d4, the second member 22 moves in the −X axis direction, which is reverse to the direction (+X axis direction) of the step movement of the substrate P. When the substrate P is positioned at the position d4. 5, the second member 22 is disposed at the position shown in FIG. 11(F) with respect to the projection region PR (the optical path K of the exposure light EL). When the substrate P is positioned at the position d5, the second member 22 is disposed at the position shown in FIG. 11(G) with respect to the projection region PR (the optical path K of the exposure light EL). That is, during the stepping operation movement of the substrate P from the position d4 to the position d5, the second member 22 moves in the +X axis direction, which is the same as the direction (+X axis direction) of the step movement of the substrate P. When the substrate P is positioned at the position d6, the second member 22 is disposed at the position shown in FIG. 11(H) with respect to the projection region PR (the optical path K of the exposure light EL). That is, during the scan operation movement of the substrate P from the position d5 to the position d6, the second member 22 moves in the −X axis direction, which is reverse to the direction (+X axis direction) of the step movement of the substrate P.

In the present embodiment, the positions of the second member 22 shown in FIGS. 11(A), 11(D), and 11(G) include the second end position. The positions of the second member 22 shown in FIGS. 11(B), 11(E), and 11(H) include the first end position. The positions of the second member 22 shown in FIGS. 11(C) and 11(F) include the center position.

In descriptions below, the positions of the second member 22 shown in FIGS. 11(A), 11(D), and 11(G) are set to the second end position, the positions of the second member 22 shown in FIGS. 11(B), 11(E), and 11(H) are set to the first end position, and the positions of the second member 22 shown in FIGS. 11(C) and 11(F) are set to the center position.

Moreover, when the substrate P is positioned at the positions d1, d3, and d5 shown in FIG. 10, the second member 22 may be disposed at the center position and may be disposed at between of the second end position and the center position. Additionally, when the substrate P is positioned at the positions d2, d4, and d6 the second member 22 may be disposed at the center position and may be disposed at between of the first end position and the center position. Moreover, when the substrate P is positioned at the positions d2. 5 and d4. 5, the second member 22 may be disposed at the positions different from the center position. That is, when the substrate P is positioned at the positions d2. 5 and d4. 5, the second member 22 may be disposed between the first end position and the center position or between the second end position and the center position.

When the substrate P moves the pathway Tp1, the second member 22 moves in the −X axis direction so as to be changed from the state shown in FIG. 11(A) to the state shown in FIG. 11(B). That is, the second member 22 moves from the second end position to the first end position via the center position. When the substrate P moves the pathway Tp2, the second member 22 moves in the +X axis direction so as to be changed from the state shown in FIG. 11(B) to the state shown in FIG. 11(D) via the state shown in FIG. 11(C). That is, the second member 22 moves from the first end position to the second end position via the center position. When the substrate P moves the pathway Tp3, the second member 22 moves in the −X axis direction so as to be changed from the state shown in FIG. 11(D) to the state shown in FIG. 11(E). That is, the second member 22 moves from the second end position to the first end position via the center position. When the substrate P moves the pathway Tp4, the second member 22 moves in the +X axis direction so as to be changed from the state shown in FIG. 11(E) to the state shown in FIG. 11(G) via the state shown in FIG. 11(F). That is, the second member 22 moves from the first end position to the second end position via the center position. When the substrate P moves the pathway Tp5, the second member 22 moves in the −X axis direction so as to be changed from the state shown in FIG. 11(G) to the state shown in FIG. 11(H). That is, the second member 22 moves from the second end position to the first end position via the center position.

That is, in the present embodiment, the second member 22 moves in the +X axis direction so that the relative movement between the second member and the substrate P is decreased in at least a part of the period in which the substrate P moves along the pathway Tp2. In other words, the second member 22 moves in the +X axis direction so that the relative speed between the second member and the substrate P with respect to the X axis direction is decreased in at least a part of the period in which the substrate P performs the step movement operation which includes the component in the +X axis direction. Similarly, the second member 22 moves in the +X axis direction so that the relative speed between the second member and the substrate P with respect to the X axis direction is decreased in at least a part of the period in which the substrate P moves along the pathway Tp4.

In addition, in the present embodiment, the second member 22 moves in the −X axis direction in at least a part of the period in which the substrate P moves along the pathway Tp3. Thereby after the movement of the substrate P on the pathway Tp3, in the movement of the pathway Tp4, even when the second member 22 moves in the +X axis direction, the exposure light EL is able to pass through the opening 35. Also in the case where the substrate P moves the pathways Tp1 and Tp5, the exposure light is able to pass through the opening.

That is, when the substrate P repeats the scan movement operation and the step movement operation including the component in the +X axis direction, during the step movement operation, the second member 22 moves in the +X axis direction from the first end position to the second end position so that the relative speed between the second member and the substrate P is decreased, and during the scan movement operation, the second member 22 returns from the second end position to the first end position so that the second member 22 moves in the +X axis direction again in the next step movement operation. That is, since the second member 22 moves in −X axis direction in at least a part of the period in which the substrate P performs the vertical scan movement operation, the size of the opening 35 can be suppressed to the required minimum.

Moreover, in the embodiment, even when the second member 22 is disposed at the first end position (second end position), at least a portion of the recovery part 23 (lower surface 39) continuously faces the substrate P (object). In other words, in the state where the second member 22 is disposed at the first end position (second end position), a portion of the recovery part 23 (lower surface 39) faces the second member 22, and a portion of the recovery part 23 (lower surface 39) does not face the second member 22. Thereby, for example, in the step movement operation, the recovery part 23 is able to recover the liquid on the substrate P (object).

Furthermore, in the present embodiment, before the substrate P starts the step movement operation including the component in the +X axis direction, the second member 22 starts the movement from the first end position to the second end position. That is, before the substrate P starts the movement in the pathway Tp2 (Tp4), the second member 22 starts the movement in the +X axis direction. Moreover, at the same time as the substrate P starts the step movement operation including the component in the +X axis direction, the second member 22 may start the movement from the first end position to the second end position. In other words, at the same time as the substrate P starts the movement in the pathway Tp2 (Tp4), the second member 22 may start the movement in the +X axis direction. Alternatively, after the substrate P starts the movement in the pathway Tp2 (Tp4), the second member 22 may start the movement in the +X axis direction.

Furthermore, in the present embodiment, at the same time as the substrate P starts the scan movement operation, the second member 22 starts the movement from the second end position to the first end position. In other words, at the same time as the substrate P starts the movement in the pathway Tp1 (Tp3 and Tp5), the second member 22 starts the movement in the −X axis direction, which is the direction reverse to the direction (+X axis direction) of the step movement of the substrate P. Moreover, after the substrate P starts the movement in the pathway Tp1 (Tp3 and Tp5), the second member 22 may start the movement in the −X axis direction. Alternatively, before the substrate P starts the movement in the pathway Tp1 (Tp3 and Tp5), the second member 22 may start the movement in the −X axis direction.

Figure 12:
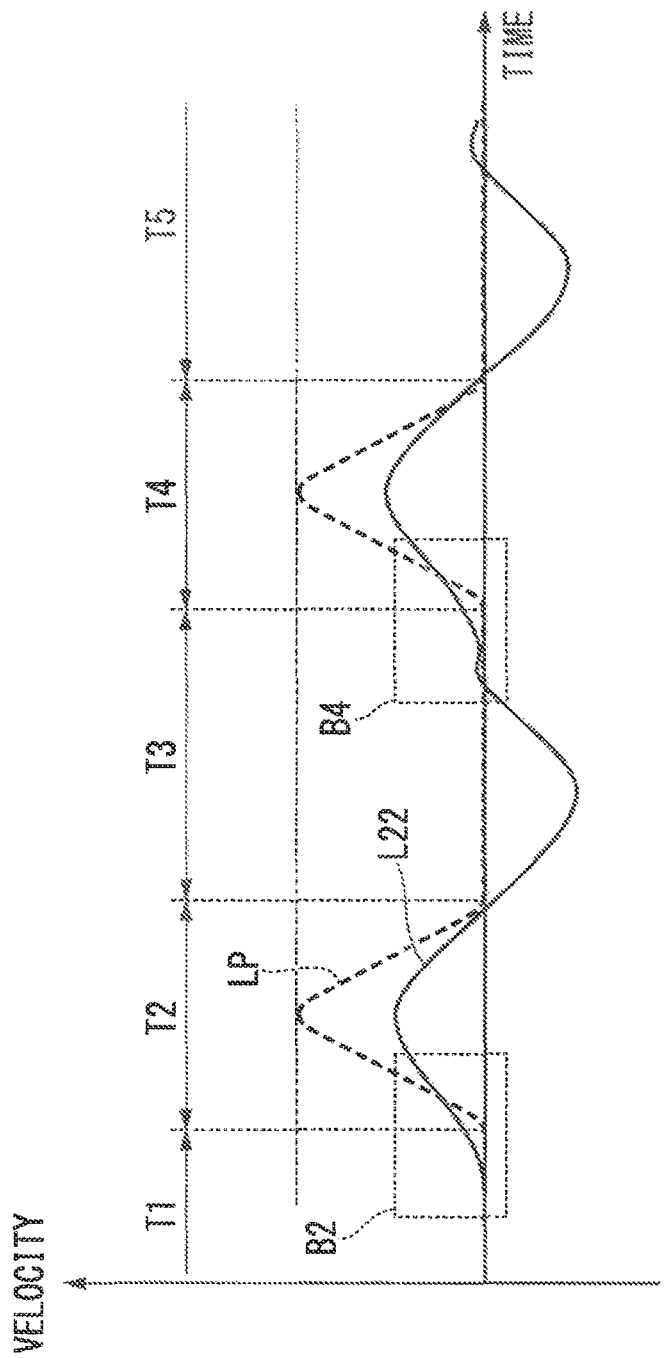
FIG. 12 is a schematic view for explaining an example of the operation of the exposure apparatus according to the first embodiment.

FIG. 12 is a view showing an example of a relationship between the speed of the substrate P (substrate stage 2) and the speed of the second member 22, and time with respect to the X axis direction in the present embodiment. In the graph shown in FIG. 12, the horizontal axis represents the time, and the vertical axis represents the speed. In FIG. 12, a line LP indicates the speed of the substrate P (substrate stage 2), and a line L22 indicates the speed of the second member 22.

In FIG. 12, periods T1, T3, and T5 are periods in which the scan movement operation is performed. That is, the period T1 corresponds to the movement period of the substrate P from the position d1 to the position d2 in FIG. 10. The period T3 corresponds to the movement period of the substrate P from the position d3 to the position d4 in FIG. 10. The period T5 corresponds to the movement period of the substrate P from the position d5 to the position d6 in FIG. 10. Furthermore, periods T2 and T4 are periods in which the step movement operation is performed. That is, the period T2 corresponds to the movement period of the substrate P from the position d2 to the position d3 in FIG. 10. The period T4 corresponds to the movement period of the substrate P from the position d4 to the position d5 in FIG. 10. In FIG. 12, as shown in portions B2 and B4, in the present embodiment, before the substrate P starts the movement in pathways Tp2 and Tp4 (before the substrate P starts the step movement operation including the component in the +X axis direction), the second member 22 starts the movement in the +X axis direction.

Figure 13:
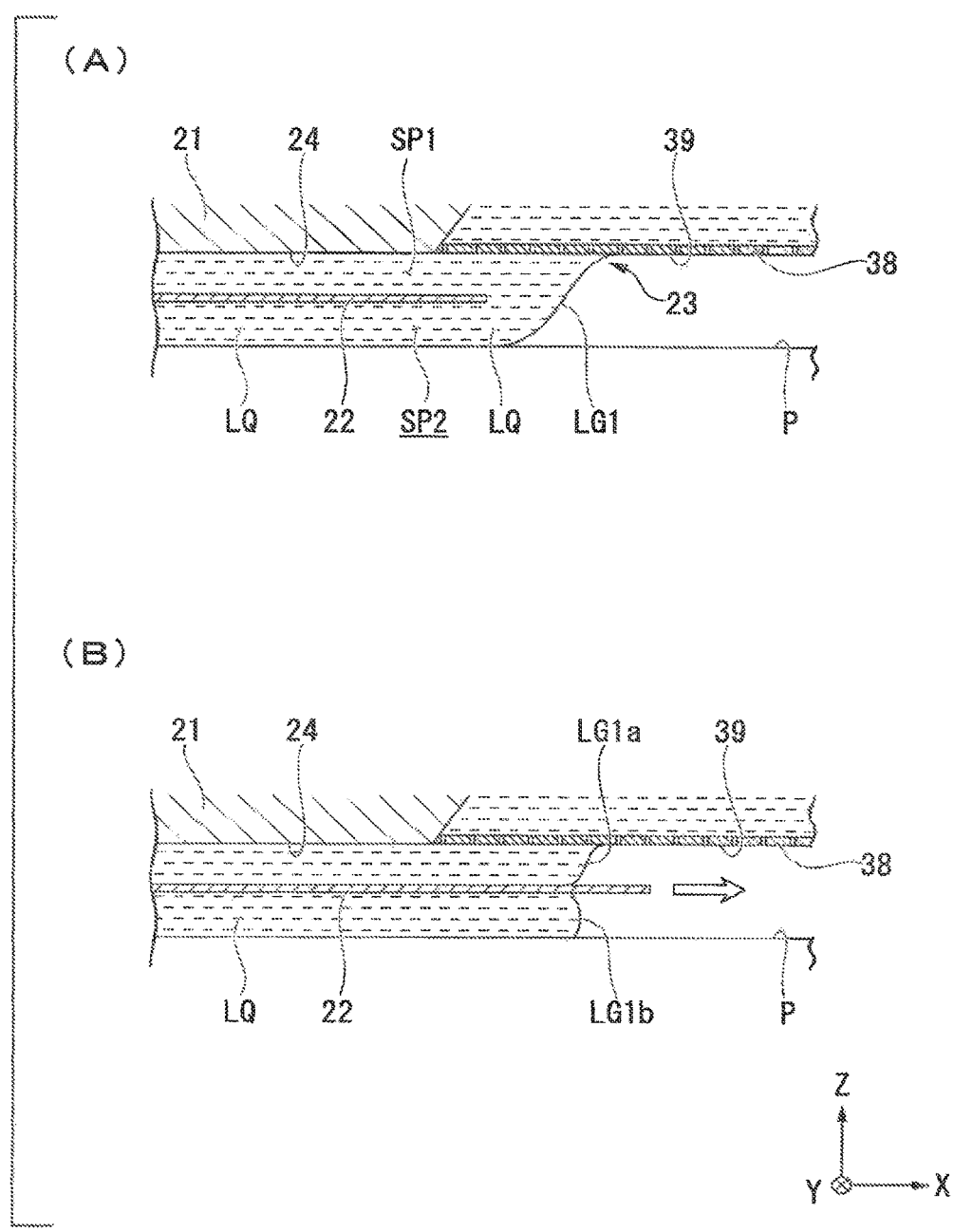
FIG. 13 is a schematic view for explaining an example of the operation of the liquid immersion member according to the first embodiment.

FIG. 13 shows an example of a state where the second member 22 starts the movement in +X axis direction before the substrate P starts the movement in the pathway Tp2 (Tp4). FIG. 13(A) shows an example of the state before the second member 22 starts the movement, and FIG. 13(B) shows an example of the state immediately after the second member 22 starts the movement. That is, FIG. 13(A) shows an example of the state in the scan movement operation.

In FIG. 13(A), the first interface LG1 of the liquid LQ is formed between the first member 21 (porous member 38) and the substrate P (object). The recovery part 23 is able to recover the liquid LQ from the first space SP1 and the liquid LQ from the second space SP2. That is, in the present embodiment, the recovery part 23 is able to recover the liquid LQ from the first space SP1 and the liquid LQ from the second space SP2 in at least a portion of the scan movement operation. Moreover, in FIG. 13(A), a portion of the recovery part 23 and the second member 22 faces each other, and a portion of the recovery part 23 is arranged outside of the second member 22 (lower surface 26) with respect to the optical path K (optical axis AX). However, the entire recovery part 23 may be arranged outside of the second member 22 (lower surface 26) with respect to the optical path K (optical axis AX). That is, at least in a part of the scan movement operation, the recovery part 23 may be disposed so as not to face the upper surface 23 of the second member 22.

Furthermore, at least in a part of the scan movement operation, there is a possibility that the recovery part 23 does not contact the liquid LQ from the first space SP1. For example, in FIG. 13(A), there is a possibility that an interface of the liquid LQ is formed between the lower surface 24 of the first member 21 and the upper surface 25 of the second member 22. In this case, the liquid LQ from the first space SP1 is not recovered from the recovery part 23 and the liquid LQ from the second space SP2 is recovered exclusively.

As shown in FIG. 13(B), since the second member 22 starts the movement in the +X axis direction before the substrate P starts the movement in the pathway Tp2 (Tp4), the interface LG1a of the liquid LQ is formed between the first member 21 and the second member 22, and the interface LG1*b* of the liquid LQ is formed between the second member 22 and the substrate P (object). Thereby, even when the substrate P moves in the +X axis direction, an outflow of the liquid LQ is suppressed. In the state shown in FIG. 13(B), the liquid LQ exclusive from the first space SP1 is recovered from the recovery part 23, and the recovery of the liquid LQ from the second space SP2 is suppressed from the recovery part 23. Moreover, in FIG. 13(B), a portion of the recovery part 23 and the second member 22 are opposite to each other, and a portion of the recovery part 23 is disposed outside the second member 22 (lower surface 26) with respect to the optical path K (optical axis AX). That is, in a state shown in FIG. 13(B), a portion of the recovery part 23 is facing the upper surface 25 of the second member 22. Moreover, before the substrate P starts the movement in the pathway Tp2 (Tp4), entire of the recovery part 23 may face the upper surface 25 of the second member 22.

Moreover, as shown in FIG. 12, in the present embodiment, the speed of the second member 22 with respect to the X axis direction in the step movement operation is lower than the speed of the substrate P (substrate stage 2). Moreover, the speed of the second member 22 may be the same as the speed of the substrate P (substrate stage 2) and may be higher than the speed of the substrate P (substrate stage 2). That is, the substrate P (substrate stage 2) may have higher speed and lower speed than the second member 22, and may have the same speed as the second member 22.

Furthermore, in FIG. 12, in the present embodiment, the acceleration of the second member 22 with respect to the X axis direction in the step movement operation is lower than the acceleration of the substrate P (substrate stage 2). Moreover, the acceleration of the second member 22 may be the same as the acceleration of the substrate P (substrate stage 2) and may be higher than the acceleration of the substrate P (substrate stage 2).

Furthermore, in the present embodiment, the movement distance of the second member 22 with respect to the X axis direction during the step movement operation period is shorter than the movement distance of the substrate P (substrate stage 2). For example, the movement distance of the second member 22 in the step movement operation may be 45 to 65% of the movement distance of the substrate P (substrate stage 2). For example, the movement distance of the second member 22 may be any of 45%, 50%, 55%, 60%, and 65% of the movement distance of the substrate P (substrate stage 2). In the present embodiment, the movement distance of the second member 22 in the step movement operation is the distance between the first end position and the second end position. Moreover, in the present embodiment, the movement distance of the second member 22 with respect to the X axis direction during the step movement operation period is shorter than a distance (distance A) between the center of a predetermined shot region S and the center of the shot region S adjacent in the X axis direction with respect to the short region S. For example, the movement distance of the second member 22 in the step movement operation may be 45 to 65% of the distance A. For example, the movement distance of the second member 22 in the step movement operation may be any of 45%, 50%, 55%, 60%, and 65% of the distance A. Moreover, the movement distance of the second member 22 with respect to the X axis direction in the step movement operation period is shorter than the size (size B) of one shot region S with respect to the X axis direction. For example, the movement distance of the second member 22 in the step movement operation may be 45 to 65% of the size B. For example, the movement distance of the second member 22 in the step movement operation may be any of 45%, 50%, 55%, 60%, and 65% of the size B. For example, when the size (size B) of the shot region S with respect to the X axis direction is 26 mm, the movement distance of the second member 22 may be approximately 14 mm.

For example, the movement distance of the second member 22 may be determined based on the surface conditions of the substrate P. The surface conditions of the substrate P include a contact angle (a receding contact angle or the like) of the liquid LQ on the surface of a photosensitive film which forms the surface of the substrate P. Moreover, the surface conditions of the substrate P include a contact angle (a receding contact angle or the like) of the liquid LQ on the surface of a protective film (top coat film) which forms the surface of the substrate P. Furthermore, far example, the surface of the substrate P may be formed by an antireflection film. Moreover, the movement distance of the second member 22 is obtained by preliminary experiments or simulation so that the outflow (residue) of the liquid LQ in the step movement operation is suppressed.

Furthermore, the movement distance of the second member 22 may be the same as the movement distance of the substrate P (substrate stage 2) and larger than the movement distance of the substrate P (substrate stage 2).

Moreover, in the present embodiment, a distance Wfx (refer to FIG. 7) between the −X axis side end of the opening 35 and the −X axis side end of the second member 22 is equal to or more than the movement distance of the second member 22 with respect to the X axis direction in the step movement operation. Furthermore, in the present embodiment, the distance Wfx between the −X axis side end of the opening 35 and the −X axis side end of the second member 22 is the same as the distance between the +X axis side end of the opening 35 and the +X axis side end of the second member 22. Moreover, the distance Wfx may be smaller than the movement distance of the second member 22 with respect to the X axis direction in the step movement operation. Furthermore, in the present embodiment, the distance Wfx is determined so that the condition of the above-described expression (1) is satisfied.

Moreover, in the present embodiment, a distance Wfy (refer to FIG. 7) between the −Y axis side end of the opening 35 and the −Y axis side end of the second member 22 is equal to or more than the size of one shot region S with respect to the Y axis direction. For example, when the size of the shot region S with respect to the Y axis direction is 33 mm, the distance Wfy is 33 mm or more. Furthermore, in the present embodiment, the distance Wfy between the −Y axis side end of the opening 35 and the −Y axis side end of the second member 22 is the same as the distance between the +Y axis side end of the opening 35 and the +Y axis side end of the second member 22. Moreover, in the present embodiment, the distance Wfy is determined so that the condition of the above-described expression (2) is satisfied.

Furthermore, with respect to the Y axis direction, the distance Yp between the center of the opening 35 and the outside end of the second member 22 may be equal to or more than the size of one shot region S with respect to the Y axis direction.

As described above, according to the present embodiment, since the second member 22, which is capable to move under the first member 21, is provided, even when the object such as the substrate P or the like moves in the XY plane in the state where the liquid immersion space LS is formed, for example, the liquid LQ is suppressed from flowing out from the space between the liquid immersion member 5 and the object or from remaining on the object. Moreover, bubbles (gas) are suppressed from being generated in the liquid LQ of the liquid immersion space LS.

Furthermore, since the second member 22 moves so that the relative movement (relative speed, relative acceleration) between the second member and the substrate P (object) is decreased, even when the object moves at high speed in the state where the liquid immersion space LS is formed, the liquid LQ is suppressed from flowing out or from remaining on the substrate P (object), or bubbles are suppressed from being generated in the liquid LQ.

Therefore, it is possible to suppress the occurrence of exposure failure and the occurrence of a defective device.

Moreover, in the present embodiment, since the first member 21 is disposed at at least a portion of a surrounding of the terminal optical element 13, even when the object moves or the second member 22 moves in the state where the liquid immersion space LS is formed, a change of pressure between the terminal optical element 13 and the first member 21 or a large change of the shape of the first interface LG1 of the liquid LQ is suppressed. Therefore, for example, bubbles are suppressed from being generated in the liquid LQ, or an excessive force is suppressed from being applied to the terminal optical element 13. Moreover, in the present embodiment, since the first member 21 does not substantially move, a large change of the pressure between the terminal optical element 13 and the first member 21 or a large change of the shape of the second interface LG2 of the liquid LQ is suppressed.

Furthermore, the first member 21 may be configured to be movable. Moreover, the first member 21 may be movable with respect to the terminal optical element 13. The first member 21 may be movable in at least one direction of six directions of the X axis, Y axis, Z axis, θX, θY, and θZ axis directions. For example, in order to adjust the positional relationship between the terminal optical element 13 and the first member 21 or the positional relationship between the first member 21 and the second member 22, the first member 21 may be movable. Moreover, the first member 21 may be movable in parallel with at least part of the movement of the substrate P (object). For example, the first member may be movable by a distance shorter than the second member 22 in the XY plane. Moreover, the first member 21 may be movable at a speed lower than the second member 22. Furthermore, the first member 21 may be movable at an acceleration lower than the second member 22.

Moreover, in the present embodiment, the supply amount of the liquid from the supply ports 33 may be adjusted based on the movement conditions of the second member 22. Furthermore, the supply amount of the liquid from the supply ports 33 may be adjusted based on the position of the second member 22. For example, the supply amount of the liquid from the supply ports 33 when the second member 22 is disposed at at least one of the first end position and the second end position may be adjusted so as to be larger than the supply amount of the liquid from the supply ports 33 when the second member 22 is disposed at the center position. Moreover, when the second member 22 moves from the second end position to the first end position, the supply amount of the liquid from the supply ports 33 which are disposed at the +X axis side with respect to the optical path K may be adjusted so as to be larger than the supply amount of the liquid from the supply ports 33 which are disposed at the axis side. Furthermore, when the second member 22 moves from the first end position to the second end position, the supply amount of the liquid from the supply ports 33 which are disposed at the −X axis side with respect to the optical path K may be adjusted so as to be larger than the supply amount of the liquid from the supply ports 33 which are disposed at the +X axis side. Thereby, bubbles are suppressed from being generated in the liquid LQ.

Figure 14:
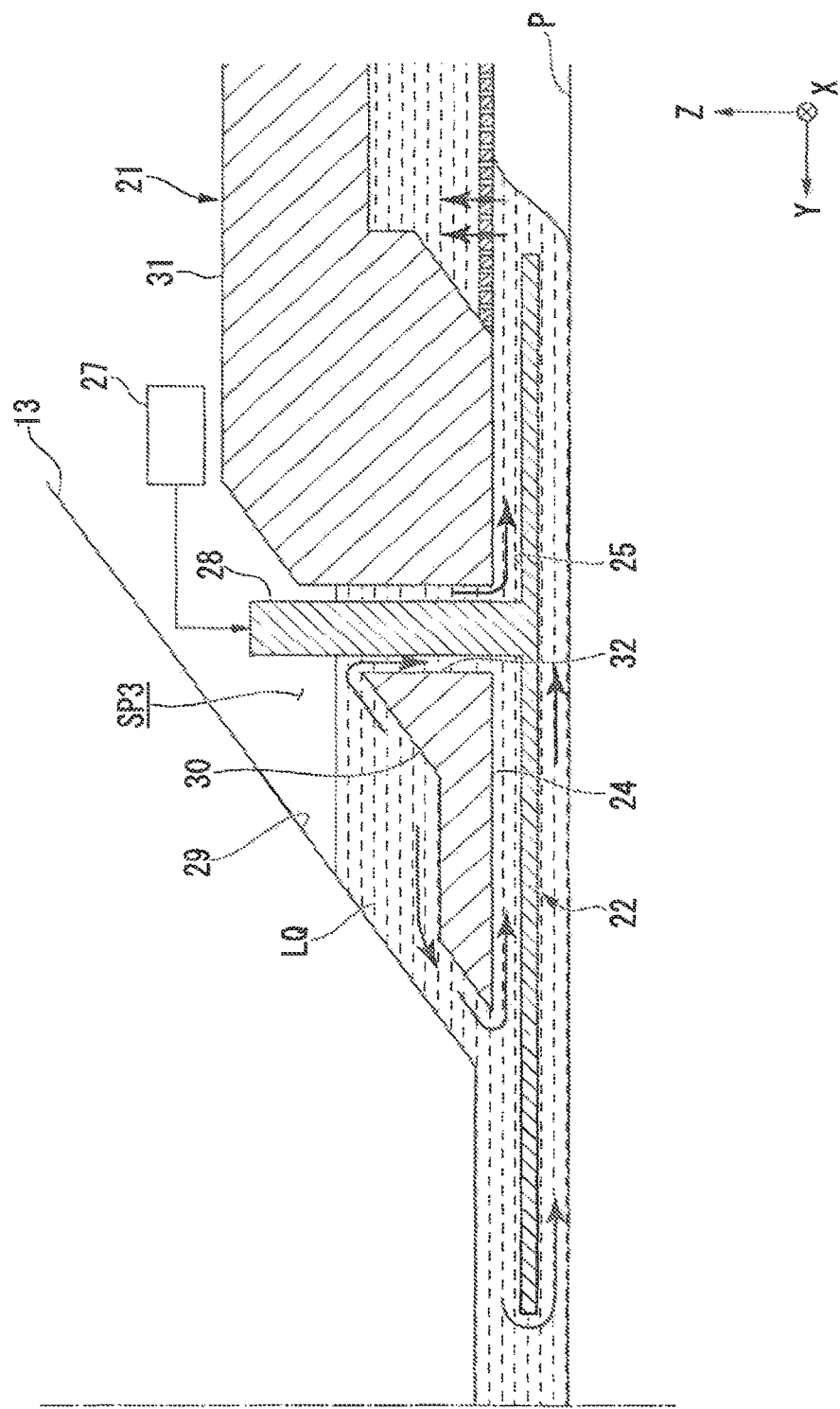
FIG. 14 is a side cross-sectional view showing a portion of the liquid immersion member according to the first embodiment.

Moreover, in the present embodiment, the first member 21 includes holes 32 which are formed so as to connect the inner surface 30 and the lower surface 24 of the first member 21. Thereby, as shown in FIG. 14, at least a portion of the liquid LQ between the side surface 29 of the terminal optical element 13 and the inner surface 30 of the first member 21 may flow to the upper surface 25 of the second member 22 via the holes 32. That is, the liquid LQ of the third space SP3 may flow to the second space SP2 via the holes 32. Thereby the liquid LQ of the third space SP3 between the side surface 29 and the inner surface 30 is suppressed from flowing out (overflowed) to the upper surface 31 or the like. Of course, by considering the shape or the like of the inner surface 30, the liquid LQ of the third space SP2 may be made not to flow to the second space SP3.

Moreover, by providing channels different from the holes 32 in the first member 21, the liquid LQ of the third space SP3 may be made to flow to the upper surface 25 of the second member 22 via the channels.

Moreover, in the present embodiment, in order to suppress the residue of the liquid LQ due to the step movement operation of the substrate P, the second member 22 is moved in the step direction (X axis direction) during the step movement operation of the substrate P. However, in order to suppress the residue of the liquid LQ due to the scan movement operation of the substrate P, the second member 22 may be moved in the scan direction (Y axis direction) during the scan movement operation of the substrate P.

Second Embodiment

A second embodiment will be described. In descriptions below, the same reference numerals are used to the same or similar components as those of the first embodiment, and the descriptions thereof are simplified or omitted.

Figure 15:
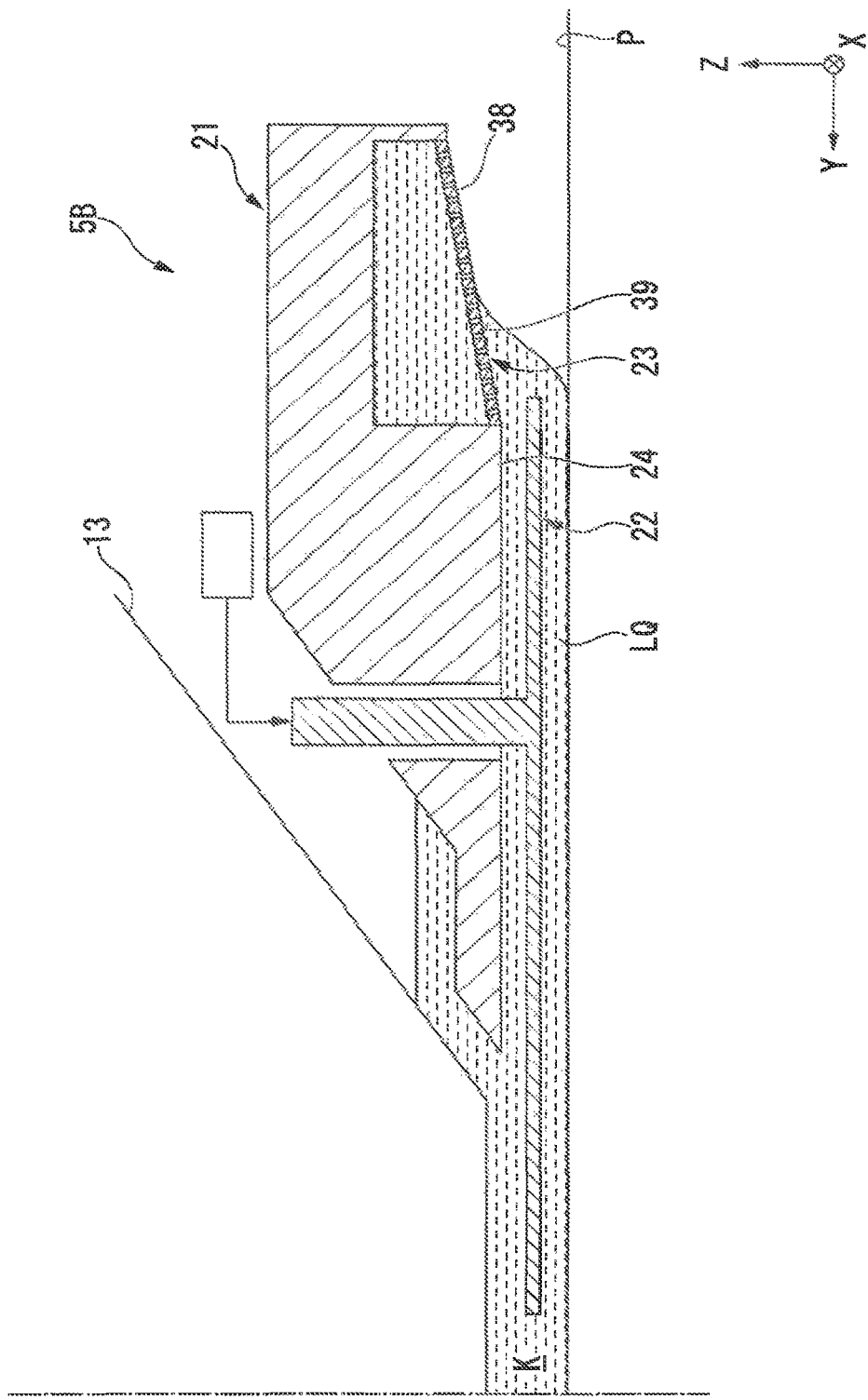
FIG. 15 is a side cross-sectional view showing a portion of a liquid immersion member according to a second embodiment.

FIG. 15 shows a view showing an example of a liquid immersion member 5B according to the present embodiment. In the first embodiment, the lower surface 24 and the lower surface 39 of the recovery part 23 (porous member 38) are disposed at the same surface. However, the lower surface 24 and the lower surface 39 may form an angle. For example, as shown in FIG. 15, at least a portion of the lower surface 39 of the recovery part 23 (porous member 38) may be inclined upward toward the outside with respect to the radial direction to the optical path K. Since the lower surface 39 is inclined as in FIG. 15, for example, even when the substrate P (object) moves in the XY plane, the outflow of the liquid LQ from between the first member 21 and the substrate P (object) is suppressed.

Moreover, when the lower surface 24 and the lower surface 39 are provided so as to be approximately parallel to the XY plane, the heights (positions in the Z axis direction) of the lower surface 24 and the lower surface 39 may be different from each other.

Third Embodiment

A third embodiment will be described, in descriptions below; the same reference numerals are used to the same or similar components as those of the above-described embodiments, and the descriptions thereof are simplified or omitted.

Figure 16:
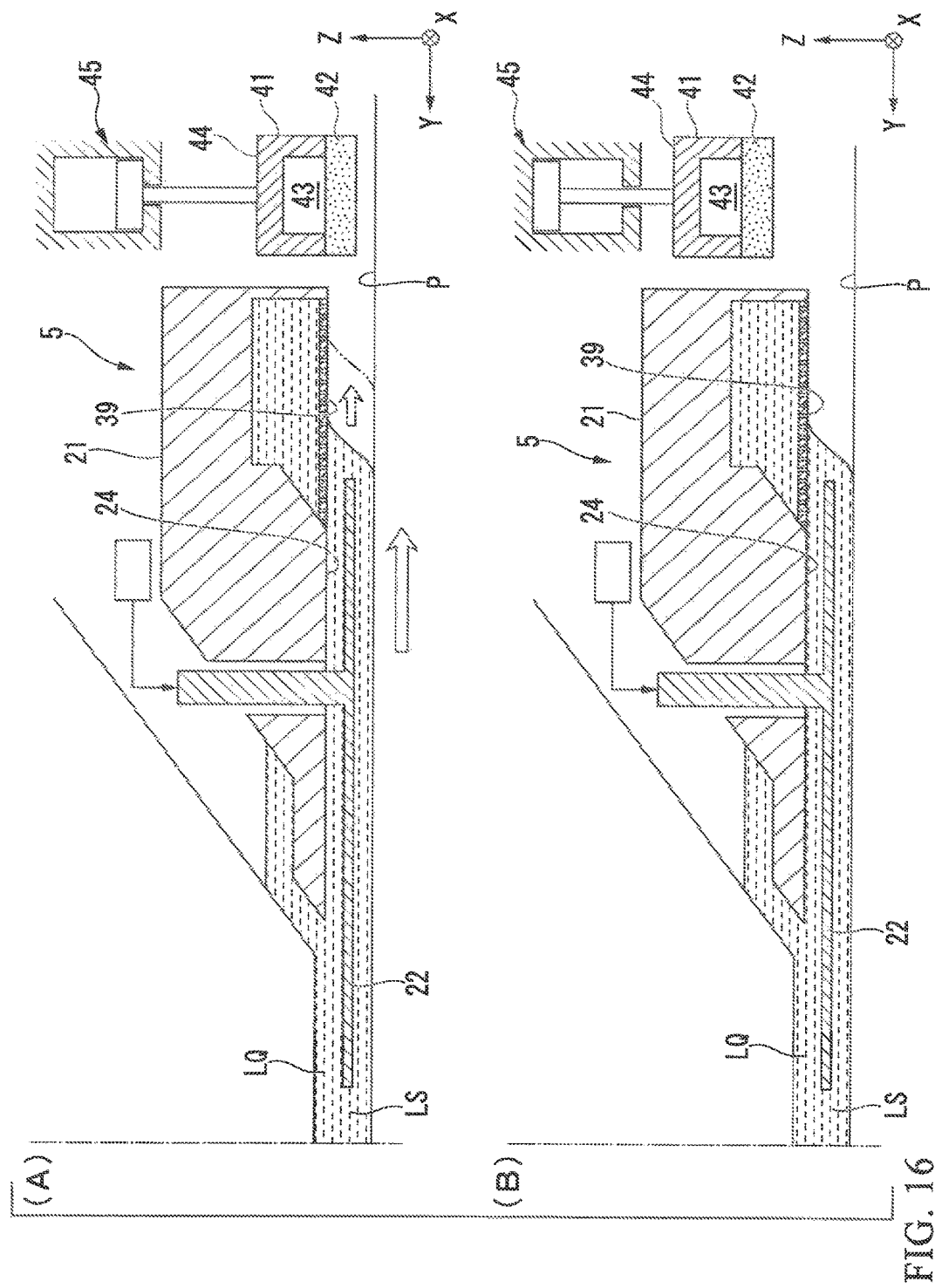
FIG. 16 is a view showing an example of a liquid immersion member according to a third embodiment.

As shown in FIG. 16, the exposure apparatus EX of the present embodiment includes at least one recovery member 41 which is disposed at at least a portion of a surrounding of the first member 21 and is to recover the liquid LQ flowing out from the lower surface 24 (lower surface 39) side. The recovery member 41 includes a porous member 42 which the substrate P (object) is able to face and a support member 44 which forms a space (recovery channel) 43 between the support member and the porous member 42. The support member 44 supports the porous member 42. The recovery channel 43 is connected to the liquid recovery apparatus (not shown) which includes a vacuum system. According to the operation of the liquid recovery apparatus, the liquid LQ on the substrate P (object) which contacts the lower surface of the porous member 42 flows into the recovery channel 43 via holes of the porous member 42 and is recovered to the liquid recovery apparatus. The holes of the porous member 42 function as recovery ports of the recovery member 41.

The recovery member 41 may be an annular member which surrounds the first member 21. FIG. 16 shows the recovery member 41 which is arranged at the −Y axis side with respect to the first member 21.

In the present embodiment, the recovery member 41 is moved by a driving system 45. The recovery member 41 is disposed at above the substrate P (object). The driving member 45 moves the recovery member 41 at the upper portion of the substrate P (object). The driving system 45 moves the recovery member 41 so that the recovery member 41 and the substrate P (object) do not contact each other. Moreover, the driving system 45 moves the recovery member 41 so that the recovery member 41, and the first member 21 and the second member 22 do not contact each other.

The driving system 45 is able to move the recovery member 41 in the up-down direction (Z axis direction). That is, the driving member 45 is able to move the recovery member 41 so that the recovery member 41 and the substrate P (object) approach each other. Moreover, the driving system 45 is able to move the recovery member 41 so that the recovery member 41 and the substrate P (object) are away from each other. Furthermore, the driving system 45 may move the recovery member 41 in at least one direction of the X axis, Y axis, Z axis, θX, θY, and θZ axis directions.

The driving system. 45 moves the recovery member 41 in the up-down direction based on the movement conditions of the substrate P (object).

As shown in FIG. 16(A), for example, when the substrate P (object) moves in the −Y axis direction in the state where the liquid immersion space LS is formed, the driving system 45 moves the recovery member 41 in the −Z axis direction so that the recovery member 41 (porous member 42) and the substrate P (object) approach each other. If the substrate P (object) moves in the −Y axis direction in the state where the liquid immersion space LS is formed, there is a possibility that the liquid LQ of the liquid immersion space LS flows out to the −Y axis side of the first member 21. Since the recovery member 41 is moved so as to approach the substrate P (object) at the −Y axis side of the first member 21, the flowed-out liquid LQ is able to be recovered by the recovery member 41.

Moreover, as shown in FIG. 16(B), when the recovery member 41 is not used, the driving system 45 is able to move the recovery member 41 so as to be away from the substrate P (object). Furthermore, for example, when the recovery member 41 is not used includes a case where the substrate P (object) moves in the movement condition in which the liquid LQ does not flow out (the outflow of the liquid LQ is suppressed).

Moreover, the recovery member 41 may not be connected to the liquid recovery apparatus.

Moreover, the third embodiment is able to be applied to the exposure apparatus EX which includes the liquid immersion member 5B of the second embodiment.

Furthermore, in each embodiment described above, a liquid recovery part which is able to recover at least a portion of the liquid LQ of the first space SP1 may be provided at inside (at the optical path K side) than the recovery part 23.

Fourth Embodiment

A fourth embodiment will be described. In descriptions below, the same reference numerals are used to the same or similar components as those of the above-described embodiments, and the descriptions thereof are simplified or omitted.

Figure 17:
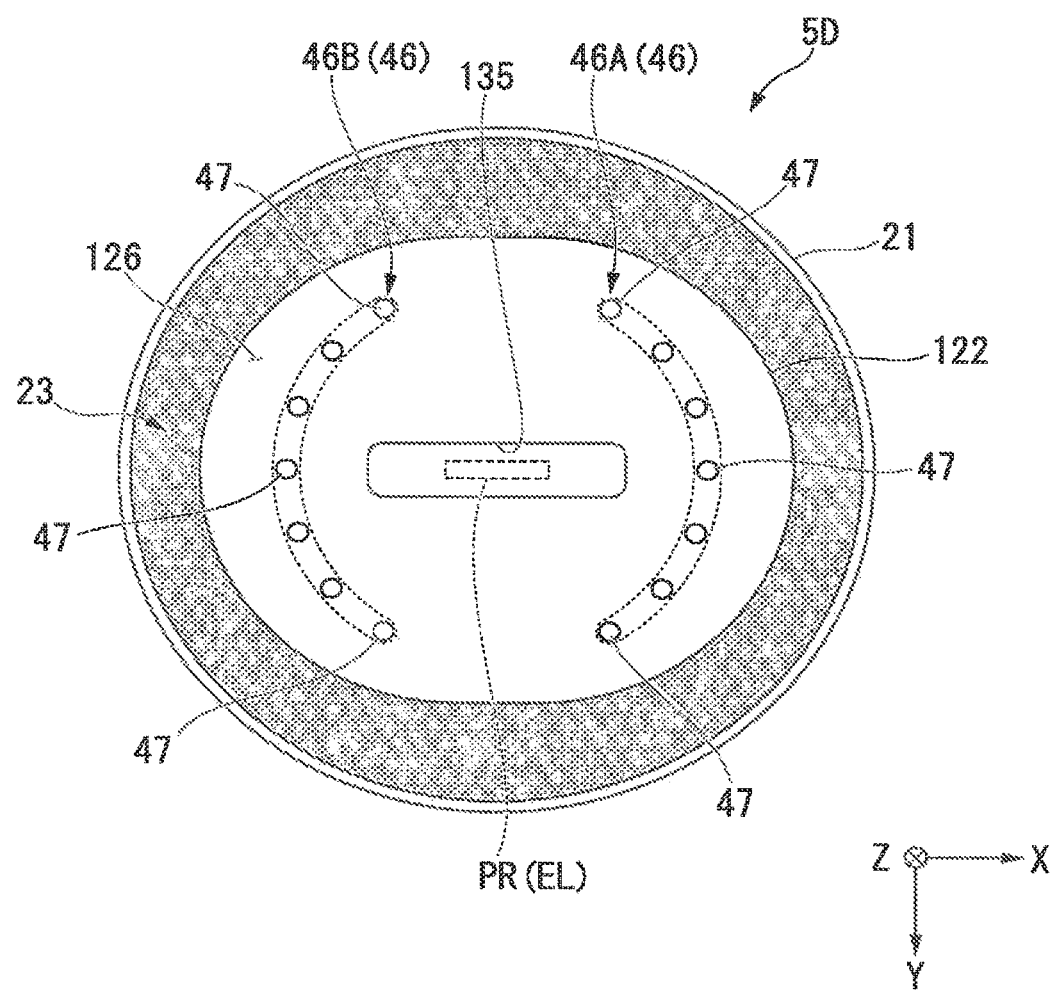
FIG. 17 is a view when a liquid immersion member according to a fourth embodiment is viewed from below.

FIG. 17 shows an example of a liquid immersion member 5D according to the present embodiment. In the present embodiment, the liquid immersion member 5D includes a second member 122. The second member 122 includes an opening 135 through which the exposure light EL passes and a lower surface 126 which the substrate P (object) faces. Moreover, the second member 122 includes a recovery part 46 which is disposed at the lower surface 126 and is able to recover the liquid LQ. The recovery part 46 includes recovery ports 47 which are disposed at the lower surface 126 and is able to connect to the vacuum system.

In the present embodiment, a liquid recovery force of the recovery part 46 of the second member 122 is smaller than the liquid recovery force of the recovery part 23 of the first member 21. The recovery part 46 recovers the liquid LQ by the liquid recovery force which is smaller than the liquid recovery force of the recovery part 23 so as not to generate gas in the optical path K. The liquid recovery force includes the liquid recovery amount per unit time.

In the present embodiment, the recovery part 46 is disposed at both sides of the optical path K of the exposure light EL with respect to the X axis direction. The recovery part 46 includes a recovery part 46A which is disposed at the +X axis side with respect to the optical path K and a recovery part 46B which is disposed at the −X axis side. In the present embodiment, the recovery part 46A includes seven recovery ports 47 which are disposed at the Y axis direction at the +X axis side with respect to the optical path K. The recovery part 46B includes seven recovery ports 47 which are disposed at the Y axis direction at the −X axis side with respect to the optical path K. The number of the recovery ports 47 is not limited to seven, and any plural number may be applied. Furthermore, slit shaped recovery ports may be provided along the recovery part (46A and 46B).

In the present embodiment, the controller 6 controls the recovery operation of the recovery part 46 based on the movement condition of the substrate P (substrate stage 2). The controller 6 performs the recovery operation of the recovery part 46 in synchronization with at least one of the scan movement operation and the step movement operation of the substrate P (substrate stage 2).

In the present embodiment, the recovery part 46 recovers the liquid LQ between the second member 122 and the substrate P in at least a period of the scan movement operation period in which the exposure light EL is radiated to the shot region S. Moreover, the recovery part 46 does not recover the liquid LQ when the step movement operation is performed in which the substrate P moves from the exposure end position of the shot region. S to the exposure start position of the next shot region S.

In the present embodiment, an opening and closing mechanism may be disposed at each of the plurality of recovery ports 47. The controller 6 opens the recovery ports 47 when the liquid LQ is recovered by the recovery part 46. Moreover, the controller 6 closes the recovery ports 47 when the liquid LQ is not recovered by the recovery part 46. Furthermore, the suction operations of the recovery ports 47 may be controlled by opening and closing the channels between the recovery ports 47 and the vacuum system.

In the scan movement operation, the liquid LQ between the second member 122 and the substrate P is recovered from the recovery part 46, and thus, the liquid immersion space LS between the second member 122 and the substrate P is suppressed from being enlarged. That is, since the liquid LQ is recovered from the recovery part 46 in the scan movement operation, in the X axis direction, the step movement operation in the X axis direction after the scan movement operation is able to start in a state where the interface of the liquid LQ between the second member 122 and the substrate P is close to the optical axis of the final optical member 13. Therefore, the liquid LQ being discharged outside the space between the first member 21 and the substrate P, due to the movement of the substrate P in the X axis direction during the step movement operation of the substrate P, can be suppressed.

Moreover, since the liquid LQ is not recovered from the recovery part 46 in the step movement operation, the liquid LQ between the lower face 126 of the second member 122 and the upper surface of the substrate P (object) is suppressed from being a thin film on the substrate P by moving away from the lower surface 126 of the second member 122 during the step movement operation. Therefore, the liquid LQ is suppressed from remaining on the substrate P.

Moreover, during the step movement operation, both the liquid recovery from the recovery ports 47 of the recovery part 46A and the liquid recovery from the recovery ports 47 of the recovery part 46B may not be stopped. For example, during the step movement operation in which the substrate P moves in the +X axis direction, the liquid suction from the recovery ports 47 of the recovery part 46B may not be stopped, and the liquid suction from the recovery ports 47 of the recovery part 46A may be stopped. Moreover, during the step movement operation in which the substrate P moves in the −X axis direction, the liquid suction from the recovery ports 47 of the recovery part 46A may not be stopped, and the liquid suction from the recovery ports 47 of the recovery part 46B may be stopped.

Furthermore, during the step movement operation, the liquid recovery from the recovery ports 47 of the recovery part 46 (46A and 46B) may not be stopped. For example, suction forces of the recovery ports 47 of the recovery part 46 (46A and 46B) during the step movement operation may be made weaker than suction forces of recovery ports 47 of the recovery part 46 (46A and 46B) during the scan movement operation. Moreover, during the step operation movement, the suction forces of the recovery ports 47 of any one of the recovery part 46A and the recovery part 46B may be made weaker. For example, during the step movement operation in which the substrate P moves in the +X axis direction, the suction forces of the recovery ports 47 of the recovery part 46A may be made weaker, and during the step movement operation in which the substrate P moves in the −X axis direction, the suction forces of the recovery ports 47 of the recovery part 46B may be made weaker.

Figure 18:
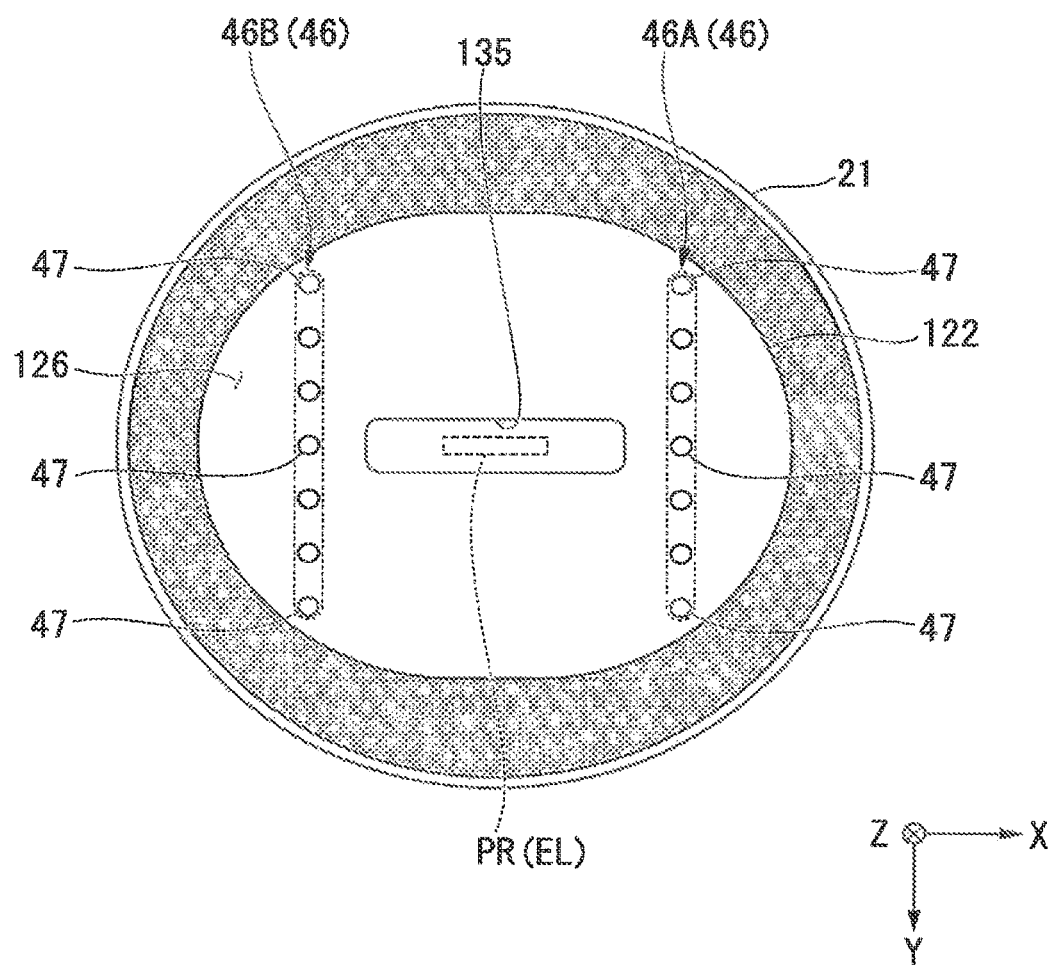
FIG. 18 is a view when the liquid immersion member according to the fourth embodiment is viewed from below.

Furthermore, in the example shown in FIG. 17, the lines, which connect the plurality of recovery ports 47 of the recovery part 46A (46B), are a curved line. As shown in FIG. 18, the lines which connect the plurality of recovery ports 47 of the recovery part 46A (46B) may be a straight line parallel to the Y axis.

Moreover, similar to each of the above-described embodiments, in the present embodiment, the second member 122 may move in parallel with at least a portion of the movement of the substrate P. However, the second member may not be movable. In that case, the driving mechanism 27 or the like may be omitted.

Fifth Embodiment

A fifth embodiment will be described. In descriptions below, the same reference numerals are used to the same or similar components as those of the above-described embodiments, and the descriptions thereof are simplified or omitted.

Figure 19:
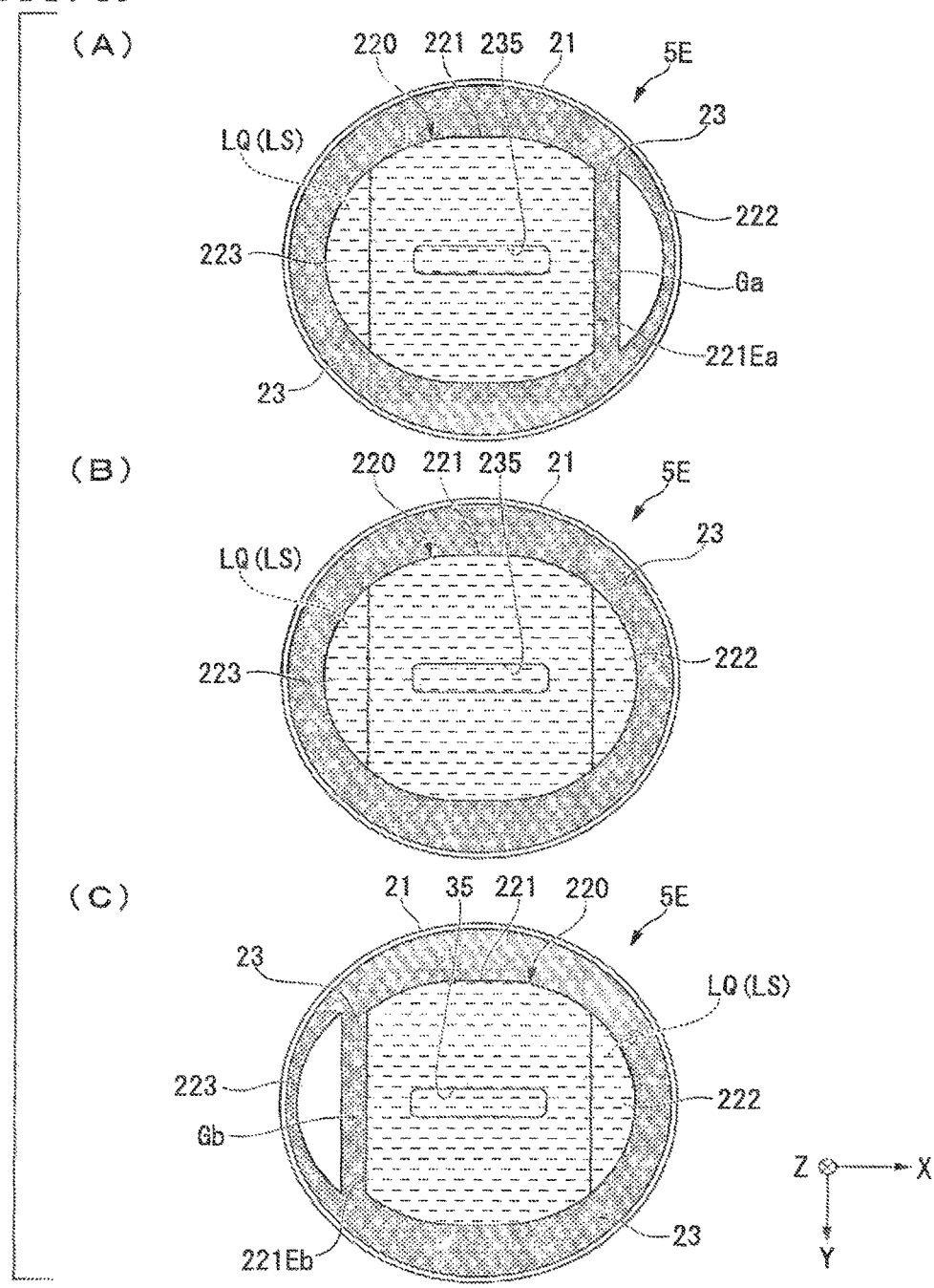
FIG. 19 is a view when a liquid immersion member according to a fifth embodiment is viewed from below.

FIG. 19 is a view showing an example of a liquid immersion member 5E according to the present embodiment. In the present embodiment, the liquid immersion member 5E includes the first member 21 which has the recovery part 23, and a second member 220 in which at least a portion is able to move with respect to the first member 21.

In the present embodiment, the second member 220 includes a first portion 221 having an opening 235 through which the exposure light EL from the emitting surface 12 is able to pass, a second portion 222 which is disposed at the +X axis side of the first portion 221 and is able to move with respect to the first portion 221, and a third portion 223 which is disposed at the −X axis side of the first portion 222 and is able to move with respect to the first portion 221.

In the present embodiment, the first portion 221 does not substantially move. The second portion 222 is able to move in the X axis direction in the space at the +X axis side of the first portion 221. The third portion 223 is able to move in the X axis direction in the space at the −X axis side of the first portion 221.

The upper surface of the second portion 222 is able to face the recovery part 23 of the first member 21. The second portion 222 is able to move in the X axis direction in the state where the recovery part 23 faces the second portion. The third portion 223 is able to face the recovery part 23. The third portion 223 is able to move in the X axis direction in the state where the recovery part 23 faces the third portion.

For example, as shown in FIG. 19(B), the edge of the +X axis side of the first portion 221 and the edge of the −X axis side of the second portion 222 which faces the edge of the +X axis side of the first portion 221 is able to approach or contact each other. Moreover, as shown in FIG. 19(B), the edge of the −X axis side of the first portion 221 and the edge of the +X axis side of the third portion 223 which faces the edge of the −X axis side of the first portion 221 is able to approach or contact each other.

Furthermore, as shown in FIG. 19(A), the second portion 222 is able to be away from the first portion 221 in the +X axis direction. In the state where the first portion 221 and the second portion 222 are away from each other, the recovery part 23 of the first member 21 is disposed at above of a gap Ga between the first portion 221 and the second portion 222. The recovery part 23 at above of the gap Ga is able to face the substrate P (object). Moreover, in the state where the first portion 221 and the second portion 222 are away from each other, the recovery part 23 of the first member 21 is able to recover the liquid LQ on the substrate P (object) via the gap Ga between the first portion 221 and the second portion 222.

Furthermore, as shown in FIG. 19(C), the third portion 223 is able to be away from the first portion 221 in the −X axis direction. In the state where the first portion 221 and the third portion 223 are away from each other, the recovery part 23 is disposed at above of a gap Gb between the first portion 221 and the third portion 223. The recovery part 23 at above of the gap Gb is able to face the substrate P (object). Moreover, in the state where the first portion 221 and the third portion 223 are away from each other, the recovery part 23 of the first member 21 is able to recover the liquid LQ on the substrate P (object) via the gap Gb between the first portion 221 and the third portion 223.

The movement of the second member 220 of the present embodiment will be described referring to FIG. 10. In the present embodiment, the second member 220 becomes in the state shown in FIG. 19(A) in at least a part of the period in which the substrate P moves the pathway Tp1. When the substrate P starts the movement in the pathway Tp2, the second member 220 is changed from the state shown in FIG. 19(A) to the state shown in FIG. 19(B). When the substrate P moves the pathway Tp2, the second member 220 becomes in the state shown in FIG. 19(B). The second member 220 becomes in the state shown in FIG. 19(A) in at least a part of the period in which the substrate P moves the pathway Tp3. When the substrate P starts the movement in the pathway Tp4, the second member 220 is changed from the state shown in FIG. 19(A) to the state shown in FIG. 19(B). When the substrate P moves the pathway Tp4, the second member 220 becomes in the state shown in FIG. 19(B). The second member 220 becomes in the state shown in FIG. 19(A) in at least a part of the period in which the substrate P moves the pathway Tp5.

That is, in the period of the scan movement operation, the second member 220 becomes in the state of FIG. 19(A), and in the period of the step movement operation in which the substrate P moves in the +X axis direction, the second member becomes in the state of FIG. 19(B).

As described above, for example, in the state shown in FIG. 19(A), the recovery part 23 of the first member 21 faces the substrate P, and the liquid LQ of the substrate P is recovered via the gap Ga. Therefore, the liquid LQ is not substantially present in the lower surface side of the second portion 222, and the interface LG1b of the liquid LQ between the second member 220 and the substrate P is positioned near the +X axis side edge 221Ea of the first portion 221. Moreover, even immediately after it is changed from the state shown in FIG. 19(A) to the state shown in FIG. 19(B), the interface LG1b of the liquid LQ between the second member 220 and the substrate P is positioned near the +X axis side edge 221Ea of the first portion 221.

Figure 20:
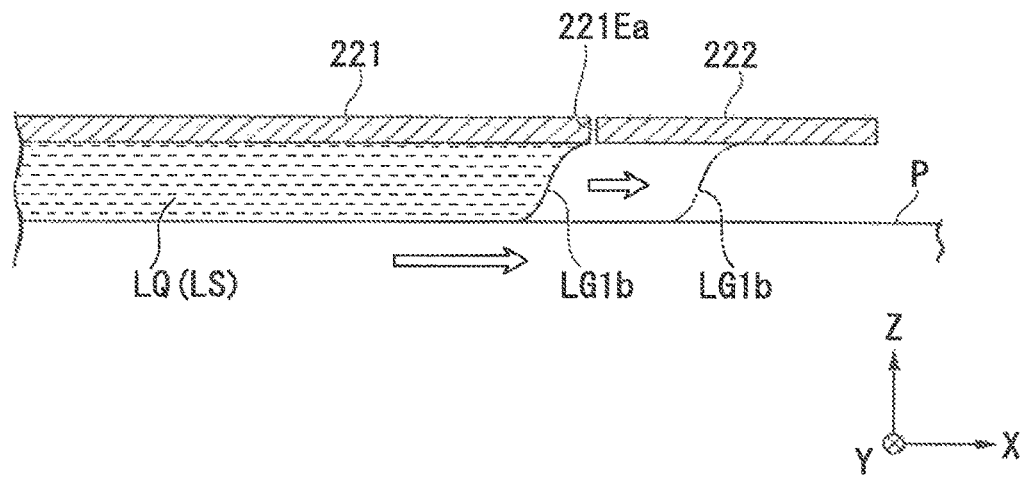
FIG. 20 is a schematic view for explaining an example of an operation of the liquid immersion member according to the fifth embodiment.

Thereby, for example, as shown in FIG. 20, when the first portion 221 and the second portion 222 approach or contact each other and the step movement operation of the substrate P in the +X axis direction starts, the interface LG1b of the liquid LQ is formed near the edge 221Ea of the first portion 221, and the liquid LQ is not substantially present in the lower surface side of the second portion 222. That is, in the state where the interface LG1b of the liquid LQ is close to the optical axis AX of the terminal optical element 13 with respect to the X axis direction, the stepping operation of the substrate P in the +X axis direction starts. Therefore, even when the substrate P (object) performs the stepping movement operation in the +X axis direction, the outflow of the liquid LQ from between the second member 220 and the substrate P (object) is suppressed, and the liquid LQ is suppressed from being discharged outside the space between the first member 21 and the substrate P.

Moreover, during the stepping movement operation, since the first portion 221 and the second member 222 approach or contact each other and the liquid LQ is not recovered from the recovery part 23 via the gap Ga, the liquid LQ between the lower surface of the second member 220 and the substrate P is away from the lower surface of the second member 220, and the liquid is suppressed from being a thin film on the substrate P. Therefore, the liquid LQ is suppressed from remaining on the substrate P.

Furthermore, during the stepping movement operation, even when the interface LG1b of the liquid LQ between the second member 220 and the substrate P is formed between the second portion 222 and the substrate P, during at least a part of the period of the subsequent scan movement operation the first portion 221 and the second portion 222 are away from each other as shown in FIG. 19(A), and the liquid LQ of the space below the gap Ga, which is between the space below the second portion 222 and the first portion 221 and the second portion 222, is recovered via the gap Ga from the recovery part 23 of the first member 21. Thus, the interface LG1b of the liquid LQ on the substrate P is able to be returned to the vicinity of the edge 221Ea of the first portion 221.

In the above, when the substrate P (object) moves the pathway shown in FIG. 10 (pathway on which the substrate P performs the step movement operation in the +X axis direction), the case where the second portion 222 which is disposed at the +X axis side with respect to the first portion 221 moves is described as an example. When the substrate P (object) performs the step movement operation in the direction reverse to the pathway shown in FIG. 10, that is, when the substrate P (object) moves the pathway in which the substrate P (object) moves during the step movement operation in the −X axis direction, the third portion 223 which is disposed at the −X axis side with respect to the first portion 221 is moved in the −X axis direction as shown in FIG. 19(C). That is, in at least a portion of the scan movement period of the substrate P, the second member 220 becomes the state shown in FIG. 19(C). When the substrate P starts the stepping movement in the −X axis direction, the second member 220 is changed from the state shown in FIG. 19(C) to the state shown in FIG. 19(B). In at least a portion of the stepping movement period in the −X axis direction of the substrate P, the second member 220 becomes the state shown in FIG. 19(B). Similar to the case of FIG. 19(A), in the state shown in FIG. 19(C), the liquid LQ is not substantially present in the lower surface side of the third portion 223, and the interface LG1b of the liquid LQ is formed near a −X axis side edge 221Eb of the first portion 221.

Figure 21:
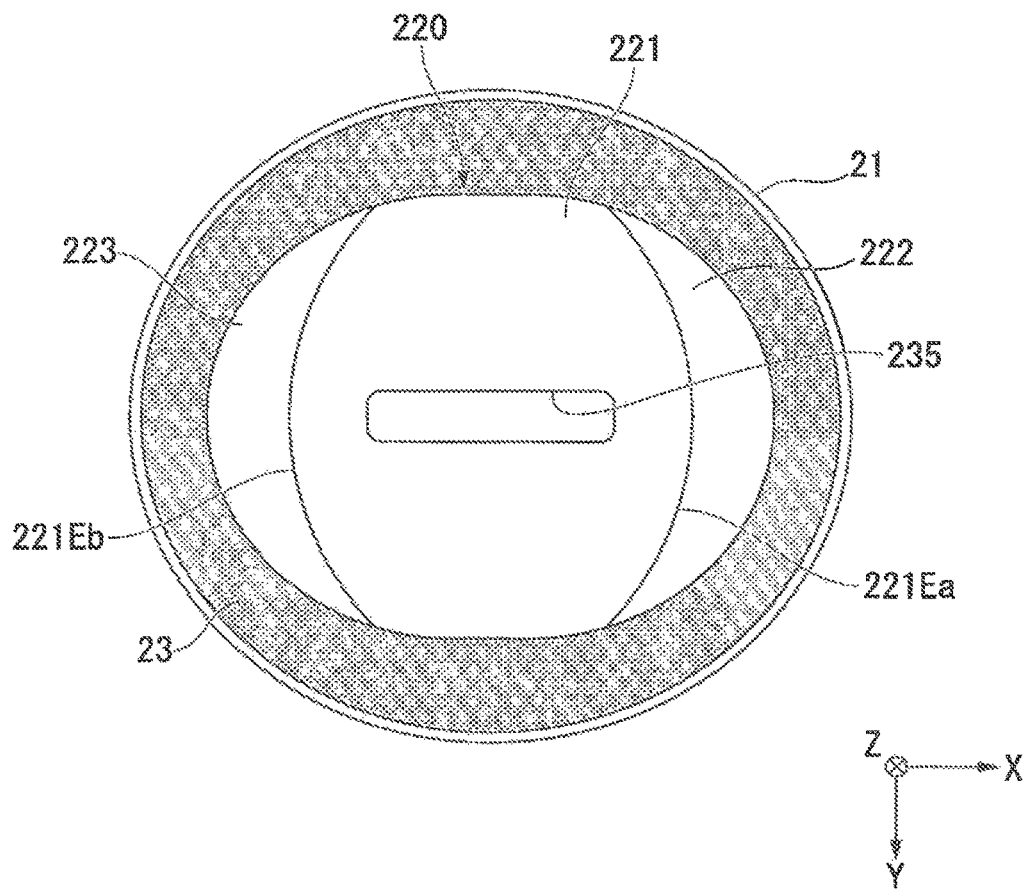
FIG. 21 is a view when the liquid immersion member according to the fifth embodiment is viewed from below.

Moreover, in the example shown in FIG. 19, the +X axis side edge and the −X axis side edge of the first portion 221, the −X axis side edge of the second portion 222, and the +X axis side edge of the third portion 223 are straight-line shapes. As shown in FIG. 21, these edges may be curved-line shapes.

Moreover, the first portion 221 may be movable. For example, in at least a part of the period of the stepping movement operation in which the substrate P moves in the +X axis direction, as shown in FIG. 19(B), the second member 220 (221, 222, and 223) may move in the +X axis direction while the state where the first portion 221, the second portion 222, and the third portion 223 are not substantially away from one another is maintained. Similarly, in at least a part of the period of the stepping movement operation in which the substrate P moves in the −X axis direction, as shown in FIG. 19(B), the second member 220 (221, 222, and 223) may move in the −X axis direction while the state where the first portion 221, the second portion 222, and the third portion 223 are not substantially away from one another is maintained.

Furthermore, in the embodiments shown in FIGS. 19 to 21, the direction in which a portion (222 and 223) of the second member 220 gets away from the portion (221) having the opening 235 is not limited to the X axis direction. For example, in at least a part of the period of the stepping movement operation, a portion of the second member 220 may be get away from the portion (221) having the opening 235 in the Y axis direction. Also in this case, the portion (221) having the opening 235 may be movable and may not be movable.

Sixth Embodiment

A sixth embodiment will be described. In descriptions below, the same reference numerals are used to the same or similar components as those of the above-described embodiments, and the descriptions thereof are simplified or omitted.

Figure 22:
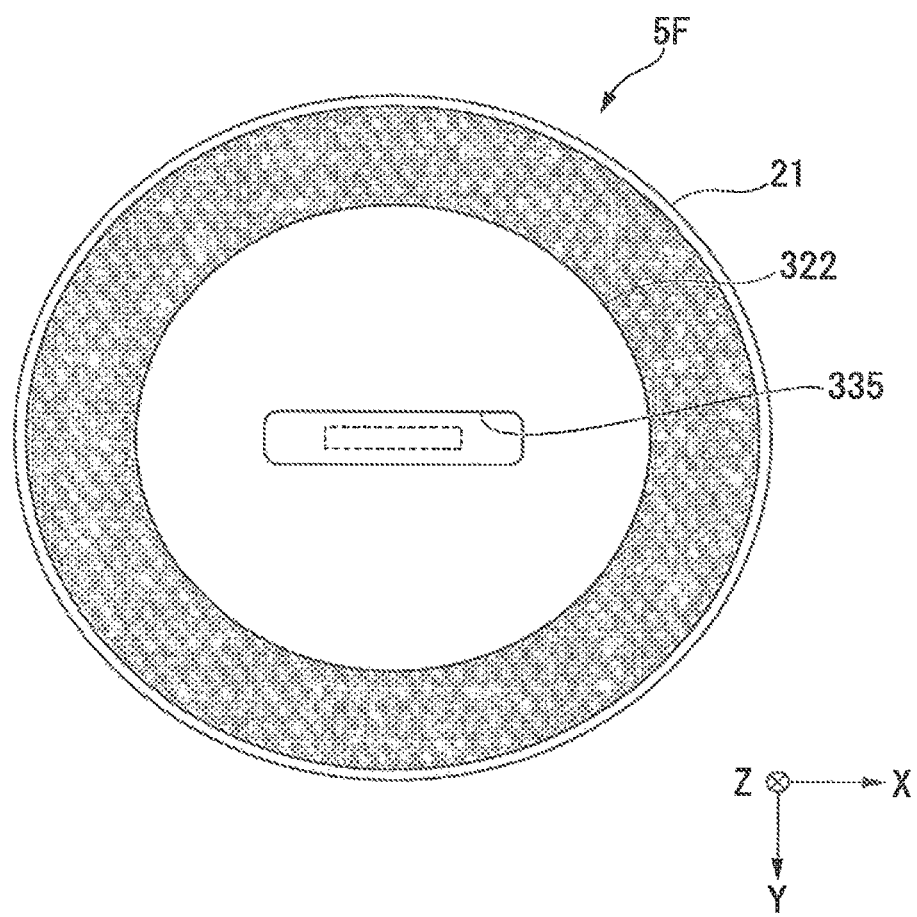
FIG. 22 is a view when a liquid immersion member according to a sixth embodiment is viewed from below.

FIG. 22 is a view when an example of a liquid immersion member 5F according to the present embodiment is viewed from below. In the first to fifth embodiments described above, the outline of the second member (22 or the like) in the XY plane is an elliptical shape in which the size with respect to the X axis direction is larger than the size with respect to the Y axis direction. As shown in FIG. 22, the outline of the second member 322 in the XY plane may be circular. Moreover, the outline of the second member 322 may be a polygonal shape such as a triangle, a quadrangle, a pentagon, a hexagon, a heptagon, and an octagon.

Seventh Embodiment

A seventh embodiment will be described. In descriptions below, the same reference numerals are used to the same or similar components as those of the above-described embodiments, and the descriptions thereof are simplified or omitted.

Figure 23:
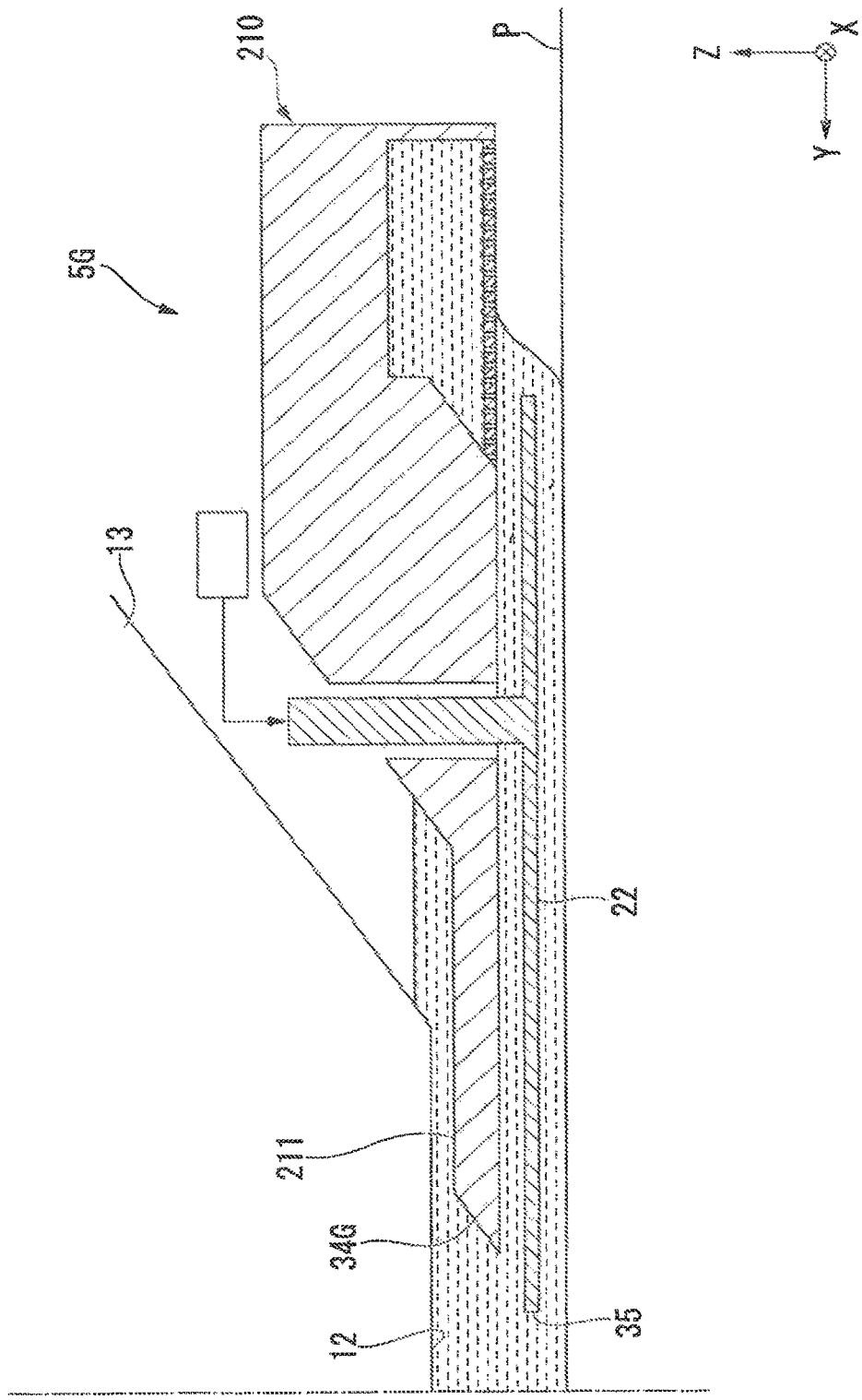
FIG. 23 is a view showing an example of a liquid immersion member according to a seventh embodiment.

FIG. 23 is a view showing an example of a liquid immersion member 5G according to the present embodiment. As shown in FIG. 23, a first member 210 of the liquid immersion member 5G includes a facing portion 211 which faces the emitting surface 12 of the terminal optical element 13. The facing portion 211 includes an opening 34G through which the exposure light EL from the emitting surface 12 is able to pass. The size of the opening 34G may be larger or smaller than, or equal to the size of the opening 35 of the second member 22.

Moreover, in the first to seventh embodiments described above, the second member 22 is an annular member which surrounds the optical path K. However, the second member may be a member which is arranged at a portion of a surrounding of the optical path K. Furthermore, the plurality of second members 22 may be disposed at a surrounding of the optical path K. Moreover, the plurality of second members 22 may move independently. Furthermore, a portion of second members 22 of the plurality of second members 22 may move, and another portion of the second members 22 may not move.

Moreover, in the first to seventh embodiments described above, the first member 21 may include recovery ports which remove the liquid LQ of the space (for example, third space SP3) above the first member 21.

Furthermore, in the above-described embodiment, the controller 6 includes a computer system which includes a CPU or the like. Moreover, the controller 6 includes an interface which is able to perform communication with the computer system and an external apparatus. For example, the storage part 7 includes a memory such as a RAM, a hard disk, and a recording medium such as a CD-ROM. In the storage part 7, an operating system (OS) which controls the computer system is installed and a program for controlling the exposure apparatus EX is stored.

Moreover, an input apparatus which is able to input signals is connected to the controller 6. The input apparatus includes input equipment such as a keyboard or a mouse or a communication apparatus or the like which is able to input data from the external apparatus. Moreover, a display apparatus such as a liquid crystal display may be provided.

The controller (computer system) 6 is able to read various information which includes the programs which are recorded in the storage part 7. Programs are recorded in the storage part 7, and the programs make the controller 6 perform the control of the liquid immersion exposure apparatus which exposes the substrate by the exposure light via the liquid filled in the optical path of the exposure light between the emitting surface of the optical member to which the exposure light is emitted and the substrate.

According to the above-described embodiments, the programs which are recorded in the storage part 7 may make the controller 6 perform: forming the liquid immersion space so that the optical path of the exposure light emitted from the emitting surface of the optical member is filled with liquid; exposing the substrate by the exposure light emitted from the emitting surface via the liquid of the liquid immersion space; moving the second member which is disposed at at least a portion of a surrounding of the optical path below the first member and includes the second upper surface which faces the first lower surface via the gap and the second lower surface which the object is able to face, with respect to the first member which is disposed at at least a portion of a surrounding of the optical member and includes the first lower surface and the first recovery part disposed outside the first lower surface with respect to the optical path; and recovering at least a portion of the liquid of at least one of the first space which the second upper surface faces and the second space which the second lower surface faces, from the first recovery part.

The programs which are stored in the storage part 7 are read by the controller 6, and thus, various apparatuses of the exposure apparatus EX such as the substrate stage 2, the measurement stage 3, and the liquid immersion member 5 cooperate with one another and perform various processing such as the liquid immersion exposure of the substrate P in the state where the liquid immersion space LS is formed.

Moreover, in each embodiment described above, the optical path K of the emitting surface 12 side (image surface side) of the terminal optical element 13 of the projection optical system PL is filled with the liquid LQ. However, for example, the projection optical system PL may be the projection optical system in which the optical path of the incident side (object surface side) of the terminal optical element 13 is also filled with the liquid LQ as disclosed in PCT International Publication No. WO 2004/019128.

Furthermore, in each embodiment described above, the liquid LQ is water. However, the liquid may be liquid other than the water. It is preferable that the liquid LQ be transparent with respect to the exposure light EL, have high refractive index with respect to the exposure light EL, and be stable with respect to the projection optical system PL or the film of a photosensitive material (photoresist) which forms the surface of the substrate P or the like. For example, the liquid LQ may be fluorinated liquid such as hydrofluoroether (HFE), perfluorinated polyether (PFPE), and Fomblin® oil. Moreover, the liquid LQ may be various fluids, for example, supercritical liquid.

Furthermore, in each embodiment described above, the substrate P includes a semiconductor wafer for manufacturing a semiconductor device. However, for example, the substrate may include a glass substrate for a display device, a ceramic wafer for a thin film magnetic head, a mask or an original plate (synthetic quartz and silicon wafer) of a reticle which is used in an exposure apparatus, or the like.

Moreover, in each embodiment described above, the exposure apparatus EX is a scanning type exposure apparatus (scanning stepper) of a step-and-scan system in which the mask M and the substrate P synchronously move and the patterns of the mask M are scanned and exposed. However, for example, the exposure apparatus may be a projection exposure apparatus (stepper) of a step-and-repeat system in which patterns of the mask M are collectively exposed in a state where the mask M and the substrate P are stationary and the substrate P is sequentially step-moved.

Furthermore, the exposure apparatus EX may be an exposure apparatus (a collective exposure apparatus of a stitch system) in which, in the exposure of a step-and-repeat system, after the reduced image of a first pattern is transferred on the substrate P using the projection optical system, in a state where a first pattern and the substrate P are substantially stationary, the reduced image of a second pattern is partially overlapped with the first pattern using the projection optical system and is collectively exposed on the substrate P in a state where the second pattern and the substrate P are substantially stationary. Moreover, the exposure apparatus of the stitch system may be an exposure apparatus of a step-and-stitch system in which at least two patterns are partially overlapped on the substrate P and transferred thereto, and the substrate P is sequentially moved.

Furthermore, for example, the exposure apparatus EX may be an exposure apparatus in which patterns of two masks are combined on the substrate via the projection optical system and one shot region on the substrate is approximately simultaneously double-exposed by single scanning exposure, as disclosed in U.S. Pat. No. 6,611,316. Moreover, the exposure apparatus EX may be an exposure apparatus of a proximity system, a mirror projection aligner, or the like.

Figure 24:
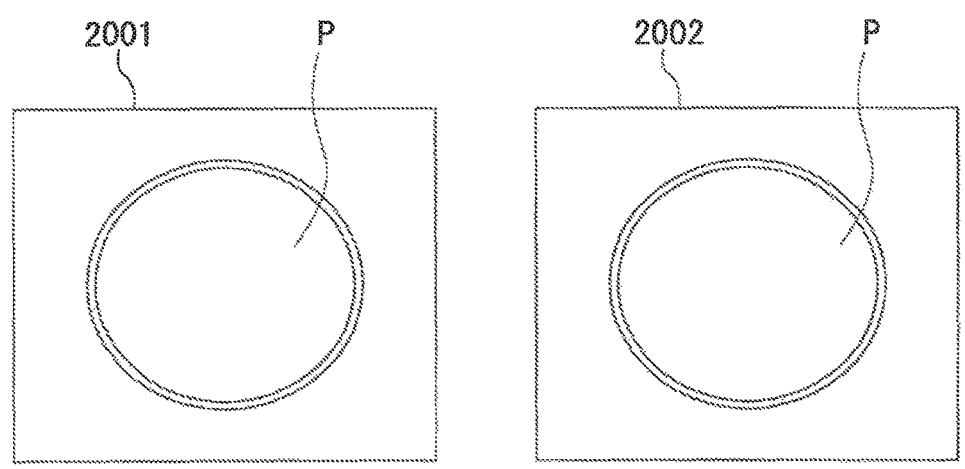
FIG. 24 is a view showing an example of a substrate stage.

Furthermore, in each embodiment described above, the exposure apparatus EX may be an exposure apparatus of a twin stage type which includes a plurality of substrate stages, as disclosed in U.S. Pat. No. 6,341,007, 6,208,407, 6,262,796, or the like. For example, as shown in FIG. 24, when the exposure apparatus EX includes two substrate stages 2001 and 2002, the object which is able to be arranged so as to face the emitting surface 12 includes at least one of one substrate stage, a substrate which is held by a first holding portion of the one substrate stage, another substrate stage, and a substrate which is held by a first holding portion of the another substrate stage.

Moreover, the exposure apparatus EX may be an exposure apparatus which includes the plurality of substrate stages and measurement stages.

The exposure apparatus EX may be an exposure apparatus for manufacturing a semiconductor element which exposes a semiconductor element pattern on the substrate P, an exposure apparatus for manufacturing a liquid crystal display element or a display, or an exposure apparatus for manufacturing a thin film magnetic head, an imaging element (CCD), a micromachine, a MEMS, a DNA chip, or a reticle or mask, or the like.

Moreover, in each embodiment described above, the light transmission type mask is used in which a predetermined light shielding pattern (or a phase pattern, a dimming pattern) is formed on the substrate having light transparency. However, instead of this mask, for example, as disclosed in U.S. Pat. No. 6,778,257, a variable molding mask (also referred to as an electronic mask, an active mask, or an image generator) may be used which forms a transparent pattern, a reflective pattern, or a light-emitting pattern based on electronic data of the pattern to be exposed. Moreover, instead of the variable molding masks which include a non-light emission type image display element, a pattern-forming apparatus which includes a self light-emission type image display element may be provided.

Furthermore, in each embodiment described above, the exposure apparatus EX includes the projection optical system PL. However, the components explained in each embodiment described above may be applied to an exposure apparatus and an exposing method which do not use the projection optical system PL. For example, the components explained in each embodiment described above may be applied to an exposure apparatus and an exposing method in which the liquid immersion space is formed between an optical member such as a lens and the substrate and the exposure light is radiated to the substrate via the optical member.

Moreover, for example, the exposure apparatus EX may be an exposure apparatus (a lithography system) in which interference fringes are formed on the substrate P, and thus, a line-and-space pattern is exposed on the substrate P, as disclosed in PCT International Publication No. WO 2001/035168.

The exposure apparatuses EX of the above-described embodiments are manufactured by assembling various subsystems including each above-described component so as to maintain predetermined mechanical accuracy, electrical accuracy, and optical accuracy. In order to secure the various accuracies, before and after the assembly, adjustment for achieving optical accuracy with respect to various optical systems, adjustment for achieving mechanical accuracy with respect to various mechanical systems, and adjustment for achieving electrical accuracy with respect to various electrical systems are performed. The process of assembling the exposure apparatus from various subsystems includes mechanical connections, wiring connections of electric circuits, piping connections of air-pressure circuits, or the like between various subsystems. Of course, the respective assembly processes of each subsystem are needed before the assembly process from various subsystems to the exposure apparatus. After the assembly process of exposure apparatus by various subsystems is finished, a general adjustment is performed, and thus, various accuracies in the overall exposure apparatus are secured. Moreover, it is preferable that the manufacturing of the exposure apparatus be performed in a clean room in which temperature, a degree of cleanness, or the like is controlled.

As shown in FIG. 25, a micro-device such as a semiconductor device is manufactured through a step 201 in which the function and performance design of the micro-device is performed, a step 202 in which a mask (reticle) is manufactured based on the design step, a step 203 in which a substrate which is a base material of the device is manufactured, a substrate processing step 204 which includes the substrate processing (exposure processing) including exposing the substrate by the exposure light from the pattern of the mask according to the above-described embodiments and developing the exposed substrate, a device assembly step (which includes manufacturing processes such as a dicing process, a bonding process, and a package process) 205, an inspection step 206, or the like.

Moreover, the conditions of each embodiment described above may be appropriately combined. Furthermore, some components may not be used. Moreover, as long as legally permitted, the disclosures of all publications and United States Patents with respect to the exposure apparatuses or the like cited in the each of the above-mentioned embodiment and modifications are incorporated in the disclosures of the present application.

What is claimed is:

1. A liquid immersion exposure apparatus comprising:
a projection system having a final element;
a liquid immersion member that forms a liquid immersion space under the final element, and
a stage having a holding portion on which a substrate is held, the stage being movable below the final element, wherein:
the liquid immersion member includes a first member that surrounds the final element and that has a liquid supply port and a first liquid suction port; and
the liquid immersion member includes a second member that is movable with respect to the first member,
the second member has a lower part under which a portion of the liquid immersion space is formed,
the second member has a second liquid suction port provided in the lower part,
the second member is moved in a moving direction substantially perpendicular to an optical axis of the final element such that a relative speed between the second member and the stage becomes lower than a relative speed between the first member and the stage, and
a recovery operation, which is performed using the second liquid suction portion, is controlled based on a movement condition of the stage.

2. The apparatus according to claim 1, wherein the movement condition includes movement speed of the stage.

3. The apparatus according to claim 1, wherein the movement condition includes movement distance of the stage.

4. The apparatus according to claim 1, wherein the movement condition includes movement direction of the stage.

5. The apparatus according to claim 1, wherein the movement condition includes movement locus of the stage.

6. The apparatus according to claim 1, wherein the movement condition includes acceleration and/or deceleration of the stage.

7. The apparatus according to claim 1, wherein the recovery operation is performed in a scan movement and/or in a step movement.

8. A device manufacturing method comprising:
exposing a substrate using the liquid immersion exposure apparatus according to claim 1; and
developing the exposed substrate.

9. A liquid immersion exposure method, comprising:
exposing a substrate with an exposure beam from a projection system having a final element, the substrate being exposed through a liquid immersion space formed under the final element by a liquid immersion member that includes (i) a first member that surrounds the final element and (ii) a second member that is movable with respect to the first member, the second member having a lower part under which a portion of the liquid immersion space is formed;
supplying liquid via a liquid supply port of the first member;
recovering the liquid via a first liquid suction port of the first member;
moving a stage having a holding portion on which the substrate is held;
moving the second member in a moving direction substantially perpendicular to an optical axis of the final element such that a relative speed between the second member and the stage becomes lower than a relative speed between the first member and the stage;
performing a recovery operation using a second liquid suction port of the second member; and
controlling the recovery operation based on a movement condition of the stage.

10. The method according to claim 9, wherein the movement condition includes movement speed of the stage.

11. The method according to claim 9, wherein the movement condition includes movement distance of the stage.

12. The method according to claim 9, wherein the movement condition includes movement direction of the stage.

13. The method according to claim 9, wherein the movement condition includes movement locus of the stage.

14. The method according to claim 9, wherein the movement condition includes acceleration and/or deceleration of the stage.

15. The method according to claim 9, wherein the recovery operation is performed in a scan movement and/or in a step movement.

* * * * *